United States Patent
Liu et al.

(10) Patent No.: US 10,938,514 B2
(45) Date of Patent: Mar. 2, 2021

(54) DATA TRANSMISSION METHOD, DATA SENDING DEVICE, AND DATA RECEIVING DEVICE

(71) Applicant: Huawei Technologies Co., Ltd., Shenzhen (CN)

(72) Inventors: Xiaojian Liu, Shenzhen (CN); Yuejun Wei, Shanghai (CN); Xin Zeng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/446,237

(22) Filed: Jun. 19, 2019

(65) Prior Publication Data
US 2019/0305885 A1    Oct. 3, 2019

Related U.S. Application Data

(63) Continuation of application No. PCT/CN2017/115705, filed on Dec. 12, 2017.

(30) Foreign Application Priority Data

Dec. 26, 2016   (CN) .......................... 201611221276.8

(51) Int. Cl.
*H04L 1/00* (2006.01)
*H03M 13/11* (2006.01)

(52) U.S. Cl.
CPC ....... *H04L 1/0057* (2013.01); *H03M 13/1157* (2013.01); *H03M 13/1162* (2013.01);
(Continued)

(58) Field of Classification Search
CPC ....... H04L 1/0057; H04L 1/00; H04L 1/0071; H04L 1/0041; H04L 1/0045;
(Continued)

(56) References Cited

U.S. PATENT DOCUMENTS 10,439,646 B2 * 10/2019 Kim .................. H03M 13/2732
2015/0339191 A1    11/2015 Park et al.
(Continued)

FOREIGN PATENT DOCUMENTS

CN           101090293 A      12/2007
CN           101095303 A      12/2007
(Continued)

OTHER PUBLICATIONS

"3rd Generation Partnership Project; Technical Specification Group Radio Access Network; Evolved Universal Terrestrial Radio Access (E-UTRA); Multiplexing and channel coding (Release 12)", 3GPP TS 36.212, V12.2.0, pp. 1-89, 3rd Generation Partnership Project, Valbonne, France (Sep. 2014).

*Primary Examiner* — James C Kerveros
(74) *Attorney, Agent, or Firm* — Leydig, Voit & Mayer, Ltd.

(57) ABSTRACT

A data transmission method, a data sending device, and a data receiving device are provided. The method includes: encoding, by a data sending device, information data by using a low-density parity-check (LDPC) code matrix, to obtain a bit sequence, where the bit sequence includes a first bit sequence, and the first bit sequence includes at least one information bit in the bit sequence; interleaving, the first bit sequence to obtain a first interleaved bit sequence; performing, modulation based on the first interleaved bit sequence to obtain a sending signal, and sending the sending signal. The method also includes: demodulating, by a data receiving device, a receiving signal to obtain a soft value sequence; and de-interleaving, the soft value sequence, to obtain a soft value sequence of a first bit sequence. This can improve a capability of an LDPC code resisting burst interference.

19 Claims, 14 Drawing Sheets

(52) U.S. Cl.
CPC ........... *H03M 13/1174* (2013.01); *H04L 1/00* (2013.01); *H04L 1/0071* (2013.01)

(58) Field of Classification Search
CPC ............ H04L 1/0063; H03M 13/1157; H03M 13/1162; H03M 13/1174; H03M 13/1185; H03M 13/255; H03M 13/271; H03M 13/1102
USPC .......................................................... 714/752
See application file for complete search history.

(56) References Cited

U.S. PATENT DOCUMENTS

| | | | |
|---|---|---|---|
| 2015/0341054 A1 | 11/2015 | Myung et al. | |
| 2016/0173135 A1 | 6/2016 | Myung et al. | |
| 2016/0344423 A1* | 11/2016 | Kim | H03M 13/2778 |

FOREIGN PATENT DOCUMENTS

| | | |
|---|---|---|
| CN | 101499805 A | 8/2009 |
| EP | 1677450 A2 | 7/2006 |
| WO | 2009094805 A1 | 8/2009 |

* cited by examiner

DATA TRANSMISSION METHOD, DATA SENDING DEVICE, AND DATA RECEIVING DEVICE

CROSS-REFERENCE TO RELATED APPLICATIONS

This application is a continuation of International Application No. PCT/CN2017/115705, filed on Dec. 12, 2017, which claims priority to Chinese Patent Application No. 201611221276.8, filed on Dec. 26, 2016. The disclosures of the aforementioned applications are hereby incorporated by reference in their entireties.

TECHNICAL FIELD

Embodiments of this application relate to the field of encoding technologies, and in particular, to a data transmission method, a data sending device, and a data receiving device.

BACKGROUND

With widespread development of multimedia and broadband mobile communications services, a wireless communications system has a higher requirement for a transmission speed and reliability. A low-density parity-check (LDPC) code has been widely applied to fields such as microwave, an optical network, and Wireless Fidelity (Wi-Fi) because of its advantages such as low complexity, a low error floor, and a capability of full-parallel decoding.

Wireless network channel encoding requires a flexible bit rate, to satisfy a requirement for implementing hybrid automatic repeat request (HARQ). Raptor-like LDPC can easily support rate matching of an LDPC code, and supports an incremental redundancy hybrid automatic repeat request (IR-HARQ), which has currently been selected as error correction coding of Enhanced Mobile Internet (Enhanced Mobile Broadband, eMBB) that is one of three scenarios of the $5^{th}$ Generation mobile communications system.

A method in which the Raptor-like LDPC code supports the IR-HARQ is sending all information bits and corresponding parity bits based on a preset code rate during initial transmission, and sending only a new parity bit during retransmission. Generally, there is relatively rich column weight distribution of a high bit rate check matrix corresponding to a bit sequence during initial transmission, and importance of these bits in a decoding process is also different from each other. If burst interference occurs, and some important bit information is damaged, decoding may completely fail, thereby reducing a system throughput rate.

Therefore, how to improve a capability of the LDPC code resisting burst interference is an issue to be urgently resolved.

SUMMARY

Embodiments of this application provide a data transmission method, a data sending device, and a data receiving device, to improve a capability of an LDPC code resisting burst interference.

According to a first aspect, a data transmission method is provided, including: encoding, by a data sending device, information data by using an LDPC code matrix, to obtain a bit sequence, where the bit sequence includes a first bit sequence, and the first bit sequence includes at least one information bit in the bit sequence; interleaving, by the data sending device, the first bit sequence to obtain a first interleaved bit sequence; performing, by the data sending device, modulation based on the first interleaved bit sequence to obtain a sending signal, and sending the sending signal; demodulating, by a data receiving device, a receiving signal to obtain a soft value sequence; and de-interleaving, by the data receiving device, the soft value sequence to obtain a soft value sequence of the first bit sequence.

In this embodiment of this application, some bit sequences in the bit sequence obtained based on encoding by using the LDPC code matrix are interleaved, so that bits of the LDPC code that have different importance can be dispersed, thereby reducing impact of burst interference, and improving the capability of the LDPC code resisting burst interference.

The LDPC code matrix may be a Raptor-like LDPC code matrix.

In a possible design, the first bit sequence may include at least one information bit in the bit sequence and at least one parity bit whose column weight is greater than 1 in the bit sequence.

In another possible design, the first bit sequence may alternatively include at least one information bit in the bit sequence and at least one parity bit whose column weight is 1 in the bit sequence, or include at least one information bit in the bit sequence, at least one parity bit whose column weight is greater than 1 in the bit sequence, and at least one parity bit whose column weight is 1 in the bit sequence.

In still another possible design, the first bit sequence may further include all information bits in the bit sequence and all parity bits whose column weights are greater than 1 in the bit sequence; or the first bit sequence includes all information bits in the bit sequence, all parity bits whose column weights are greater than 1 in the bit sequence, and at least one parity bit whose column weight is 1 in the bit sequence.

In yet another possible design, the bit sequence obtained by encoding the information data by using the LDPC code in this embodiment of this application may further include a second bit sequence, and an intersection set between bits in the second bit sequence and bits in the first bit sequence is empty.

The data sending device interleaves the first bit sequence to obtain a first interleaved bit sequence, and interleaves the second bit sequence to obtain a second interleaved bit sequence. The data sending device performs modulation based on the first interleaved bit sequence and the second interleaved bit sequence to obtain a sending signal, and sends the sending signal. The data receiving device demodulates a receiving signal to obtain a soft value sequence, and de-interleaves the soft value sequence to obtain a soft value sequence of the first bit sequence and a soft value sequence of the second bit sequence.

The first bit sequence includes all information bits in the bit sequence and all parity bits whose column weights are greater than 1 in the bit sequence, and the second bit sequence includes all parity bits whose column weights are 1 in the bit sequence; or the first bit sequence includes all information bits in the bit sequence, all parity bits whose column weights are greater than 1 in the bit sequence, and at least one parity bit whose column weight is 1 in the bit sequence, and the second bit sequence includes at least one parity bit whose column weight is 1 in the bit sequence; or the first bit sequence includes all information bits in the bit sequence, and the second bit sequence includes a parity bit whose column weight is greater than 1 in the bit sequence and at least one parity bit whose column weight is 1 in the bit sequence; or the first bit sequence includes all information bits in the bit sequence and all parity bits whose column weights are 1 in the bit sequence, and the second bit sequence includes all parity bits whose column weights are greater than 1 in the bit sequence; or the first bit sequence includes all information bits in the bit sequence and at least one parity bit whose column weight is 1 in the bit sequence, and the second bit sequence includes all parity bits whose column weights are greater than 1 in the bit sequence and at least one parity bit whose column weight is 1 in the bit sequence; or the first bit sequence includes at least one information bit in the bit sequence and all parity bits whose column weights are 1 in the bit sequence, and the second bit sequence includes all parity bits whose column weights are greater than 1 in the bit sequence and at least one information bit in the bit sequence; or the first bit sequence includes at least one information bit in the bit sequence and at least one parity bit whose column weight is 1 in the bit sequence, and the second bit sequence includes all parity bits whose column weights are greater than 1 in the bit sequence, at least one information bit in the bit sequence, and at least one parity bit whose column weight is 1 in the bit sequence.

In still yet another possible design, the bit sequence further includes a third bit sequence, an intersection set between bits in the third bit sequence and the bits in the first bit sequence is empty, and an intersection set between the bits in the third bit sequence and the bits in the second bit sequence is empty.

The data sending device interleaves the first bit sequence to obtain a first interleaved bit sequence, and interleaves the second bit sequence to obtain a second interleaved bit sequence; the data sending device interleaves the third bit sequence to obtain a third interleaved bit sequence; the data sending device performs modulation based on the first interleaved bit sequence, the second interleaved bit sequence, and the third interleaved bit sequence to obtain a sending signal, and sends the sending signal; and the data receiving device demodulates receiving information to obtain a soft value sequence, and de-interleaves the soft value sequence to obtain soft value sequences that are of the first bit sequence, the second bit sequence, and the third bit sequence.

The first bit sequence includes all information bits in the bit sequence, the second bit sequence includes all parity bits whose column weights are greater than 1 in the bit sequence, and the third bit sequence includes at least one parity bit whose column weight is equal to 1 in the bit sequence.

In a further possible design, the interleaving includes: determining, by the data sending device, a quantity of rows of an interleaving matrix and a quantity of columns of the interleaving matrix based on a length of a to-be-interleaved bit sequence, where the length of the to-be-interleaved bit sequence, the quantity of rows of the interleaving matrix, and the quantity of columns of the interleaving matrix satisfy a formula $D \leq (M \times N)$, where D is the length of the to-be-interleaved bit sequence, M is the quantity of rows of the interleaving matrix, and N is the quantity of columns of the interleaving matrix; determining, based on the determined quantity of rows of the interleaving matrix, the determined quantity of columns of the interleaving matrix, and the length of the to-be-interleaved bit sequence, an interleaving bit sequence written into the interleaving matrix, where a $0^{th}$ bit to an $(N_{D-1})^{th}$ bit in the interleaving bit sequence are dummy bits, $D=(M \times N-D)$, and an $N_D^{th}$ bit to an $(M \times N-1)^{th}$ bit in the interleaving bit sequence are successively a $0^{th}$ bit to a $(D-1)^{th}$ bit in the to-be-interleaved bit sequence; writing a bit in the interleaving bit sequence row by row into an interleaving matrix whose size is (M×N); and after column transformation is performed on the interleaving matrix into which the interleaving bit sequence is written, outputting a bit sequence column by column except the dummy bits, to obtain an interleaved bit sequence.

The data receiving device determines a quantity of rows of a de-interleaving matrix and a quantity of columns of the interleaving matrix based on a length of a to-be-deinterleaved soft value sequence, where the length of the to-be-deinterleaved soft value sequence, the quantity of rows of the de-interleaving matrix, and the quantity of columns of the de-interleaving matrix satisfy a formula $D \leq (M \times N)$ where D is the length of the to-be-deinterleaved soft value sequence, M is the quantity of rows of the de-interleaving matrix, and N is the quantity of columns of the de-interleaving matrix; the data receiving device writes a soft value in the to-be-deinterleaved soft value sequence column by column into a de-interleaving matrix whose size is (M×N); and the data receiving device outputs a soft value sequence row by row after performing column transformation on the de-interleaving matrix into which the soft value is written, to obtain a de-interleaved soft value sequence.

According to a second aspect, a data sending device is provided. The data sending device has all functions of implementing the data sending device in the foregoing data transmission method. The functions may be implemented by hardware, or may be implemented by hardware executing corresponding software. The hardware or the software includes one or more modules corresponding to the foregoing functions. The module may be software and/or hardware.

In a possible design, the data sending device includes an encoding unit, an interleaving unit, a modulation unit, and a sending unit. Functions of the encoding unit, the interleaving unit, the modulation unit, and the sending unit may correspond to the method steps respectively. Details are not described herein.

In another possible design, the data sending device includes an encoder, an interleaver, a modulator, and a transmitter. Functions of the encoder, the interleaver, the modulator, and the transmitter may correspond to the method steps respectively. Details are not described herein.

According to a third aspect, a data receiving device is provided. The data receiving device has all functions of implementing the data receiving device in the foregoing data transmission method. The functions may be implemented by hardware, or may be implemented by hardware executing corresponding software. The hardware or the software includes one or more modules corresponding to the foregoing functions. The module may be software and/or hardware.

In a possible design, the data receiving device includes a receiving unit, a demodulation unit, and a de-interleaving unit. Functions of the receiving unit, the demodulation unit, and the de-interleaving unit may correspond to method steps respectively. Details are not described herein.

In another possible design, the data receiving device includes a receiver, a demodulator, and a de-interleaver. Functions of the receiver, the demodulator, and the de-interleaver may correspond to method steps respectively. Details are not described herein.

According to the data transmission method, the data sending device, and the data receiving device provided in the embodiments of this application, interleaving may be performed on some bit sequences of an information bit sequence, the parity bit whose column weight is greater than 1, and the parity bit whose column weight is 1 that are in the bit sequence obtained based on encoding by using LDPC, so as to disperse bits of an LDPC code that have different importance, thereby reducing impact of burst interference.

DESCRIPTION OF EMBODIMENTS

The following describes embodiments of this application with reference to accompanying drawings.

Figure 1:
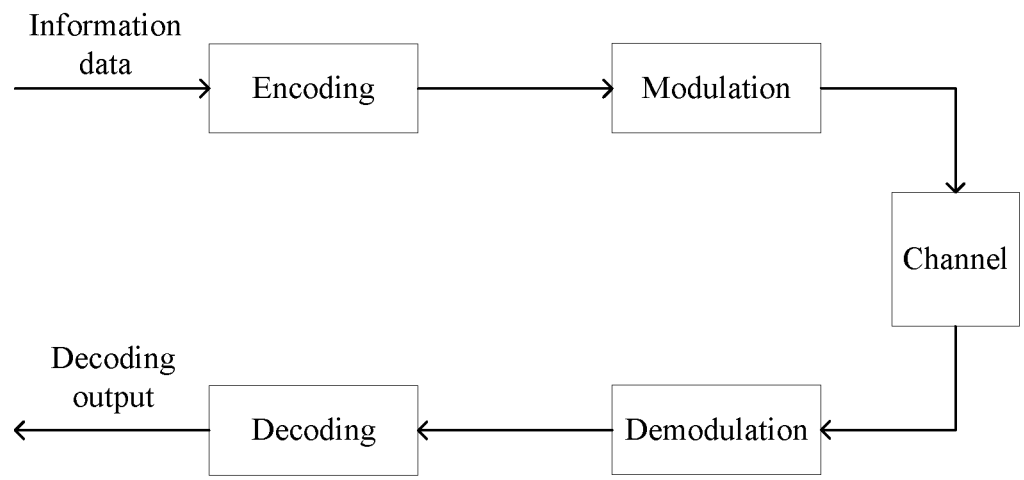
FIG. 1 is a schematic diagram of a channel encoding and decoding process in a wireless communications system.

A data transmission method provided in the embodiments of this application may be applied to a wireless communications system in which channel encoding and decoding need to be performed. For example, in FIG. 1, a data sending device encodes and modulates received information data, and sends the modulated information data through a channel; and a data receiving device performs processes such as demodulating and decoding after receiving a receiving signal, and outputs information data obtained based on decoding. The data sending device may encode the information data by using an LDPC code such as a Raptor-like LDPC code, and send, at a predetermined code rate, a bit sequence obtained based on encoding. There is relatively rich column weight distribution of a high bit rate check matrix corresponding to the sent bit sequence.

In this embodiment of this application, some bit sequences in the bit sequence that has relatively rich column weight distribution of a high bit rate check matrix may be interleaved, to disperse bits having different importance in the bit sequence obtained based on encoding by using the LDPC code, thereby reducing impact of burst interference, and improving a capability of the LDPC code resisting burst interference.

In this embodiment of this application, the following mainly describes the data transmission method for improving the capability of the Raptor-like LDPC code resisting burst interference by the data sending device and the data receiving device. The data sending device has an encoding function, an interleaving function, and a sending function. The data receiving device has a receiving function, a de-interleaving function, and a decoding function. The data sending device according to this embodiment of this application may be a device integrating an encoder, an interleaver, and a transmitter, and the data receiving device may be a device integrating a receiver, a de-interleaver, and a decoder.

The data sending device and the data receiving device in this embodiment of this application may be any device that is at a transmit end and a receive end respectively and that performs wireless data transmission. The data sending device and the data receiving device may be any device having a wireless transceiving function, and the device includes but is not limited to: a NodeB, an evolved NodeB (eNodeB), and a base station in a $5^{th}$ Generation (5G) communications system, a base station or a network device in a future communications system, an access node in a Wi-Fi system, a wireless relay node, a wireless backhaul node, and user equipment (UE). The UE may alternatively be referred to as a terminal, a mobile station (MS), a mobile terminal (MT), or the like. The UE may communicate with one or more core networks by using a radio access network (RAN), or may access a distributed network in a self-organizing or grant-free manner. The UE may alternatively access a radio network in another manner for communication, or may directly perform wireless communication with another UE. This is not limited in this embodiment of this application.

The data transmission method provided in this embodiment of this application may be applied to downlink data transmission, or may be applied to uplink data transmission, and may further be applied to device-to-device (D2D) data transmission. For the downlink data transmission, the sending device is a base station, and the corresponding receiving device is UE. For the uplink data transmission, the sending device is UE, and the corresponding receiving device is a base station. For the D2D data transmission, the sending device is UE, and the corresponding receiving device is also UE. This is not limited in this embodiment of this application.

The sending device and the receiving device in this embodiment of this application may be deployed on land, including indoors or outdoors, a handheld or in-vehicle device; or may be deployed on the water surface; or may be deployed on an aircraft, a balloon, and a satellite in the air. The UE in this embodiment of this application may be a mobile phone, a pad, a computer with a wireless transceiving function, a virtual reality (VR) terminal device, an augmented reality (AR) terminal device, a wireless terminal used in industrial control, a wireless terminal used in self driving, a wireless terminal used in telemedicine (remote medical), a wireless terminal used in smart grid, a wireless terminal used in transportation safety, a wireless terminal used in a smart city, a wireless terminal used in a smart home, or the like. An application scenario is not limited in this embodiment of this application.

In this embodiment of this application, the following uses that the LDPC code matrix is a Raptor-like LDPC code matrix as an example for description.

In this embodiment of this application, each bit in the bit sequence obtained by encoding the information data by the data sending device by using the Raptor-like LDPC code matrix corresponds to one variable node in the check matrix of the Raptor-like LDPC code.

Figure 2:
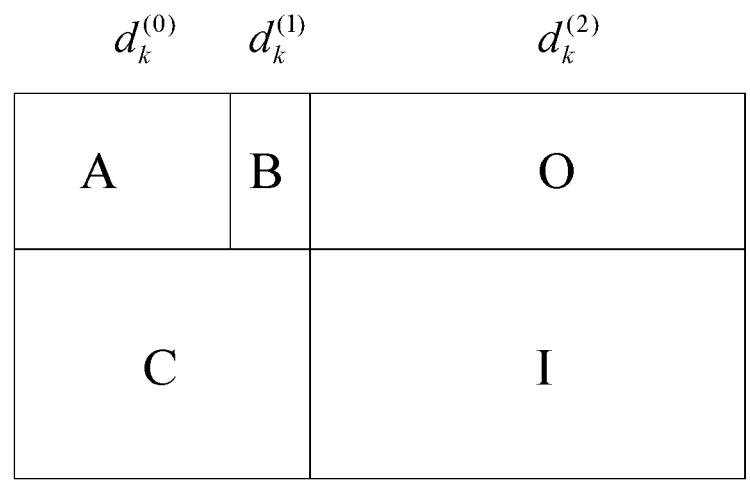
FIG. 2 is a schematic diagram of a check matrix of a Raptor-like LDPC code according to an embodiment of this application.

The check matrix of the Raptor-like LDPC code may be expressed by block as a structure shown in FIG. 2. The check matrix of the Raptor-like LDPC code in FIG. 2 includes A, B, C, O, and I. A is a matrix block corresponding to an information bit sequence in a highest bit rate check matrix. B is a matrix block corresponding to a parity bit sequence in the highest bit rate check matrix, and a matrix structure corresponding to B is usually a lower triangular structure or a combined structure of three column weights and double diagonals. C is a matrix block extended from the highest bit rate check matrix, and corresponds to the information bit sequence and the parity bit sequence in the highest bit rate check matrix. O is a zero matrix, I is a matrix whose diagonal is 1 and remaining part is 0, and O and I correspond to the parity bit sequence. It may be learned from FIG. 2 that, in this embodiment of this application, a bit sequence obtained by encoding information data by using a Raptor-like LDPC code matrix may be segmented into an information bit sequence $d_k^{(0)}$, a parity bit $d_k^{(1)}$ whose column weight is greater than 1, and a parity bit $d_k^{(2)}$ whose column weight is 1. The parity bit $d_k^{(2)}$ whose column weight is 1 is a parity bit sequence corresponding to a column whose column weight is 1 in a check matrix. The parity bit $d_k^{(1)}$ whose column weight is greater than 1 is a parity bit sequence corresponding to a column whose column weight is greater than 1 in the check matrix.

In this embodiment of this application, the data sending device may perform interleaving on some bit sequences of the information bit sequence, the parity bit whose column weight is greater than 1, and the parity bit whose column weight is 1 that are in the bit sequence, so as to disperse bits of a Raptor-like LDPC code that have different importance, thereby reducing impact of burst interference.

The following describes possible implementations.

Figure 3:
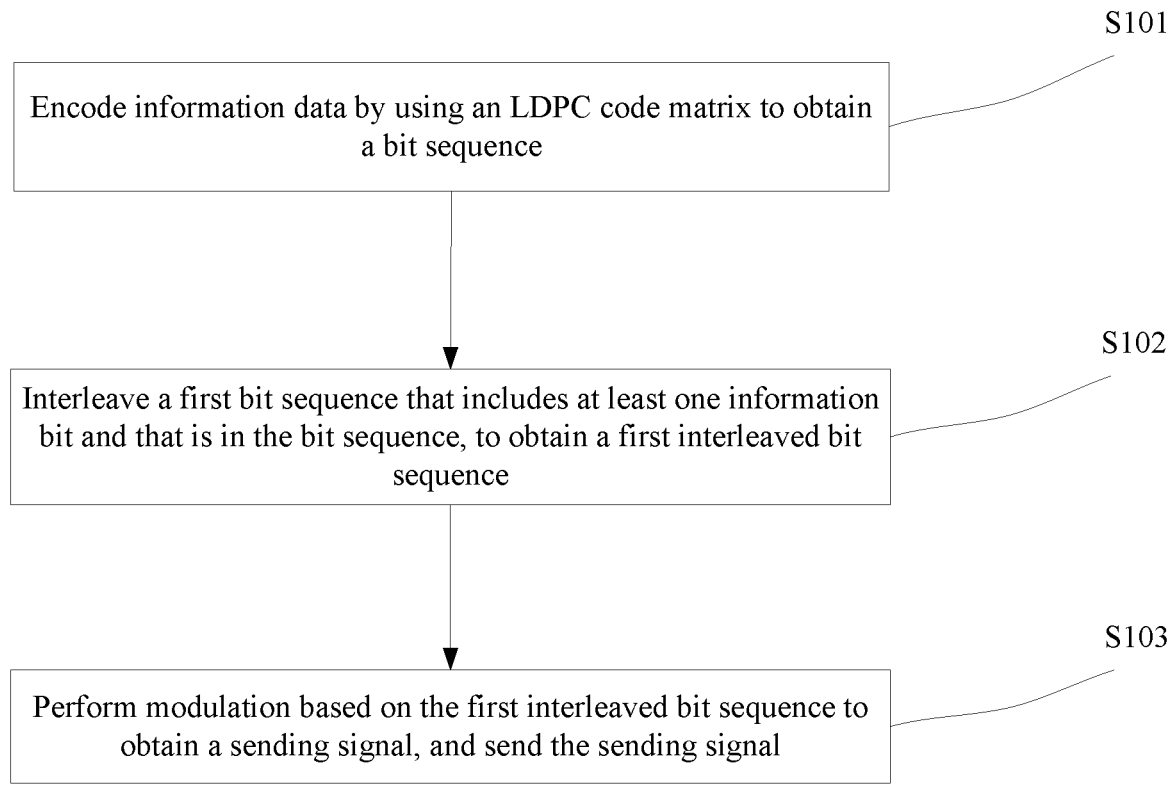
FIG. 3 is a schematic diagram of a method for performing data transmission by a data sending device according to an embodiment of this application.

FIG. 3 is a schematic diagram of a data transmission method according to an embodiment of this application. The method shown in FIG. 3 may be performed by a data sending device, or certainly may be performed by a component in the data sending device. In this embodiment of this application, that the method is performed by the data sending device is described below. As shown in FIG. 3, the method includes the following steps.

S101: The data sending device encodes information data by using an LDPC code matrix, to obtain a bit sequence.

In this embodiment of this application, the bit sequence obtained by encoding the information data by the data sending device by using the LDPC code matrix may be understood as encoded information data. In this embodiment of this application, the LDPC code matrix may be a Raptor-like LDPC code matrix.

The bit sequence in the following embodiment of this application is the bit sequence obtained by encoding the information data by using the LDPC code matrix.

The bit sequence in this embodiment of this application includes a first bit sequence, and the first bit sequence includes at least one information bit in the bit sequence.

The first bit sequence may include at least one information bit in the bit sequence and at least one parity bit whose column weight is greater than 1 in the bit sequence. The first bit sequence may alternatively include at least one information bit in the bit sequence and at least one parity bit whose column weight is 1 in the bit sequence, or include at least one information bit in the bit sequence, at least one parity bit whose column weight is greater than 1 in the bit sequence, and at least one parity bit whose column weight is 1 in the bit sequence.

The first bit sequence may alternatively include all information bits in the bit sequence and all parity bits whose column weights are greater than 1 in the bit sequence; or the first bit sequence includes all information bits in the bit sequence, all parity bits whose column weights are greater than 1 in the bit sequence, and at least one parity bit whose column weight is 1 in the bit sequence.

S102: The data sending device interleaves a first bit sequence, to obtain a first interleaved bit sequence.

S103: The data sending device performs modulation based on the first interleaved bit sequence to obtain a sending signal, and sends the sending signal.

In this embodiment of this application, some bit sequences in the bit sequence obtained based on encoding by using the LDPC code matrix are interleaved, so that bits of the LDPC code that have different importance can be dispersed, thereby reducing impact of burst interference, and improving a capability of the LDPC code resisting burst interference.

Figure 4:
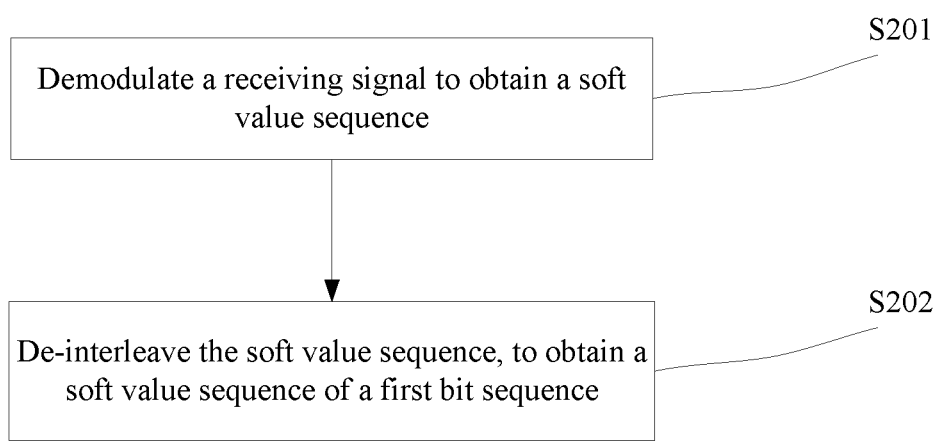
FIG. 4 is a schematic diagram of a method for performing data transmission by a data receiving device according to an embodiment of this application.

The data sending device uses the foregoing data transmission method in which at least one information bit sequence in the bit sequence obtained based on encoding by using the LDPC code matrix is interleaved, and a data receiving device may perform de-interleaving by using a method shown in FIG. 4.

FIG. 4 is a schematic diagram of another data transmission method according to an embodiment of this application. The method shown in FIG. 4 may be performed by a data receiving device, or may be performed by a component in the data receiving device. In this embodiment of this application, the following uses that the method is performed by the data receiving device as an example for description. As shown in FIG. 4, the method includes the following steps.

S201: The data receiving device demodulates a receiving signal to obtain a soft value sequence.

In this embodiment of this application, the soft value sequence may be understood as a real number sequence after a bit sequence is modulated, transmitted, channel transmitted, received, and demodulated, and each real value in the soft value sequence represents a possibility that a value of a corresponding bit is "0" or "1" at a receive end.

S202: The data receiving device de-interleaves the soft value sequence, to obtain a soft value sequence of a first bit sequence.

In this embodiment of this application, the first bit sequence corresponding to the soft value sequence is a bit sequence obtained based on encoding by using an LDPC code matrix, and the first bit sequence includes at least one information bit in the bit sequence.

In this embodiment of this application, the bit sequence obtained by encoding information data by using the LDPC code may further include a second bit sequence, and an intersection set between bits in the second bit sequence and bits in the first bit sequence is empty.

The bit sequences included in the first bit sequence and the second bit sequence have one of the following cases:

A: The first bit sequence includes all information bits in the bit sequence and all parity bits whose column weights are greater than 1 in the bit sequence, and the second bit sequence includes all parity bits whose column weights are 1 in the bit sequence.

B: The first bit sequence includes all information bits in the bit sequence, all parity bits whose column weights are greater than 1 in the bit sequence, and at least one parity bit whose column weight is 1 in the bit sequence; and the second bit sequence includes at least one parity bit whose column weight is 1 in the bit sequence.

C: The first bit sequence includes all information bits in the bit sequence, and the second bit sequence includes a parity bit whose column weight is greater than 1 in the bit sequence and at least one parity bit whose column weight is 1 in the bit sequence.

D: The first bit sequence includes all information bits in the bit sequence and all parity bits whose column weights are 1 in the bit sequence, and the second bit sequence includes all parity bits whose column weights are greater than 1 in the bit sequence.

E: The first bit sequence includes all information bits in the bit sequence and at least one parity bit whose column weight is 1 in the bit sequence, and the second bit sequence includes all parity bits whose column weights are greater than 1 in the bit sequence and at least one parity bit whose column weight is 1 in the bit sequence.

F: The first bit sequence includes at least one information bit in the bit sequence and all parity bits whose column weights are 1 in the bit sequence, and the second bit sequence includes all parity bits whose column weights are greater than 1 in the bit sequence and at least one information bit in the bit sequence.

G: The first bit sequence includes at least one information bit in the bit sequence and at least one parity bit whose column weight is 1 in the bit sequence, and the second bit sequence includes all parity bits whose column weights are greater than 1 in the bit sequence, at least one information bit in the bit sequence, and at least one parity bit whose column weight is 1 in the bit sequence.

Figure 5:
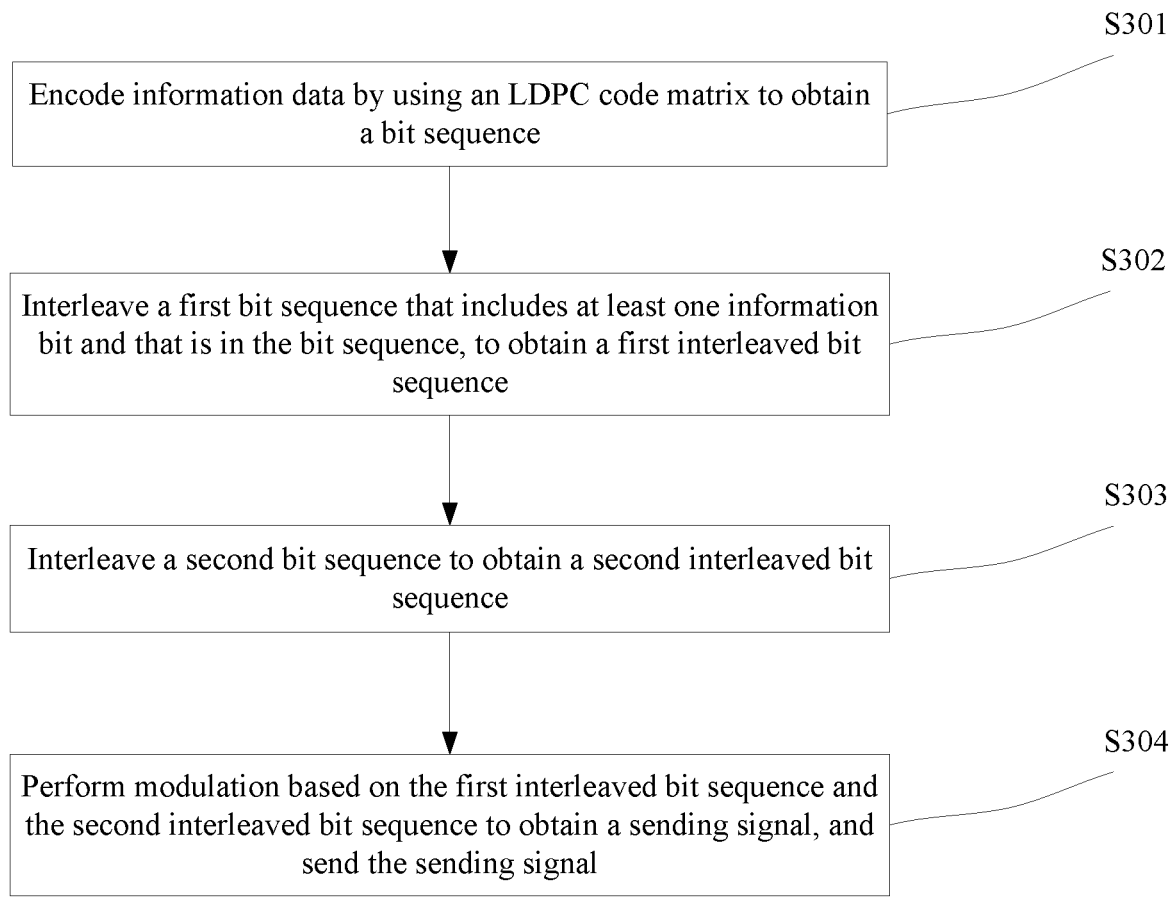
FIG. 5 is a schematic diagram of another method for performing data transmission by a data sending device according to an embodiment of this application.

In this embodiment of this application, a process that the data sending device interleaves the bit sequence including the first bit sequence and the second bit sequence and performs data transmission may be shown in FIG. 5.

The method execution steps S301 and S302 shown in FIG. 5 are the same as the method execution steps S101 and S102 shown in FIG. 3. Details are not described herein again. The following describes only differences.

S303: A data sending device interleaves the second bit sequence to obtain a second interleaved bit sequence.

There is no sequence between S302 and S303. For example, S302 may be performed before S303, or S303 may be performed before S302. Certainly, S302 and S303 may alternatively be performed synchronously.

S304: The data sending device performs modulation based on the first interleaved bit sequence and the second interleaved bit sequence to obtain a sending signal, and sends the sending signal.

Figure 6:
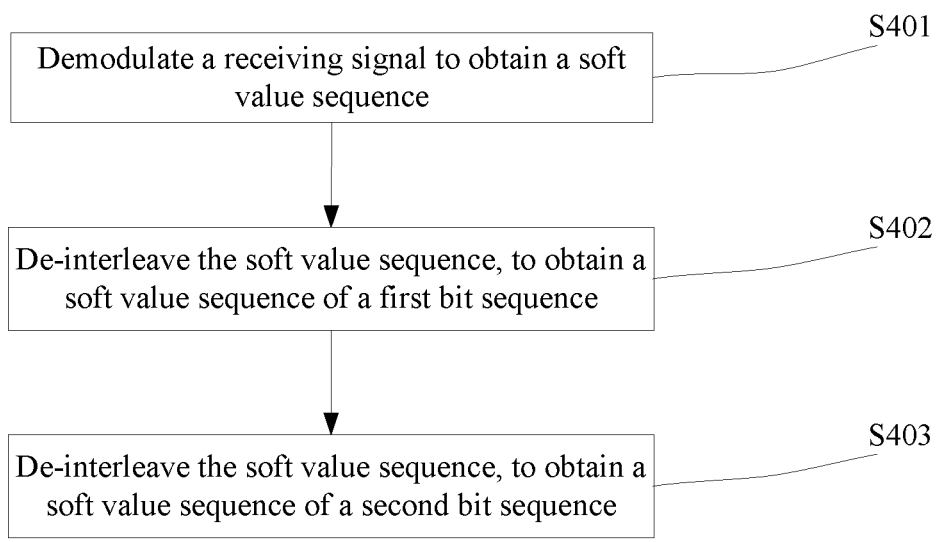
FIG. 6 is a schematic diagram of another method for performing data transmission by a data receiving device according to an embodiment of this application.

The data sending device interleaves a first bit sequence and the second bit sequence by using the data transmission method shown in FIG. 5, and a data receiving device may perform de-interleaving by using a method shown in FIG. 6.

The method execution steps S401 and S402 shown in FIG. 6 are the same as the method execution steps S201 and S202 shown in FIG. 4. Details are not described herein again. The following describes only differences.

S403: A data receiving device de-interleaves the soft value sequence, to obtain a soft value sequence of a second bit sequence.

There is no sequence between S402 and S403. For example, S402 may be performed before S402, or S403 may be performed before S402. Certainly, S402 and S403 may alternatively be performed synchronously.

The bit sequence obtained by encoding information data by using an LDPC code in this embodiment of this application may further include a third bit sequence, an intersection set between bits in the third bit sequence and bits in a first bit sequence is empty, and an intersection set between the bits in the third bit sequence and bits in the second bit sequence is empty.

The first bit sequence includes all information bits in the bit sequence, the second bit sequence includes all parity bits whose column weights are greater than 1 in the bit sequence, and the third bit sequence includes at least one parity bit whose column weight is equal to 1 in the bit sequence.

Figure 7:
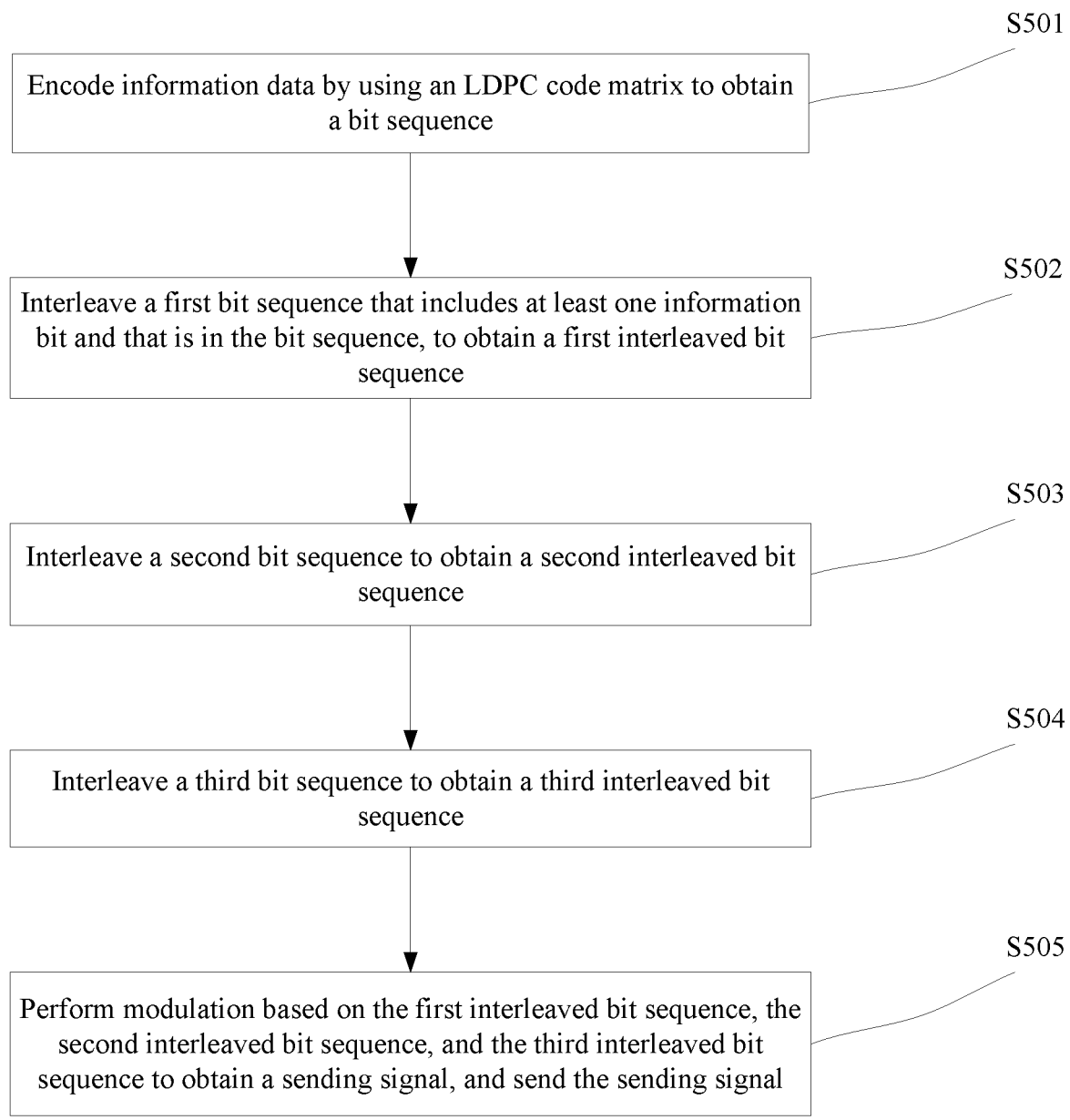
FIG. 7 is a schematic diagram of still another method for performing data transmission by a data sending device according to an embodiment of this application.

In this embodiment of this application, a process that a data sending device interleaves the bit sequence including the first bit sequence, the second bit sequence, and the third bit sequence and performs data transmission may be shown in FIG. 7.

The method execution steps S501, S502, and S503 shown in FIG. 7 are the same as the method execution steps S301, S302, and S303 shown in FIG. 5. Details are not described herein again. The following describes only differences.

S504: A data sending device interleaves the third bit sequence to obtain a third interleaved bit sequence.

There is no sequence between S502, S503, and S504.

S505: The data sending device performs modulation based on the first interleaved bit sequence, the second interleaved bit sequence, and the third interleaved bit sequence to obtain a sending signal, and sends the sending signal.

Figure 8:
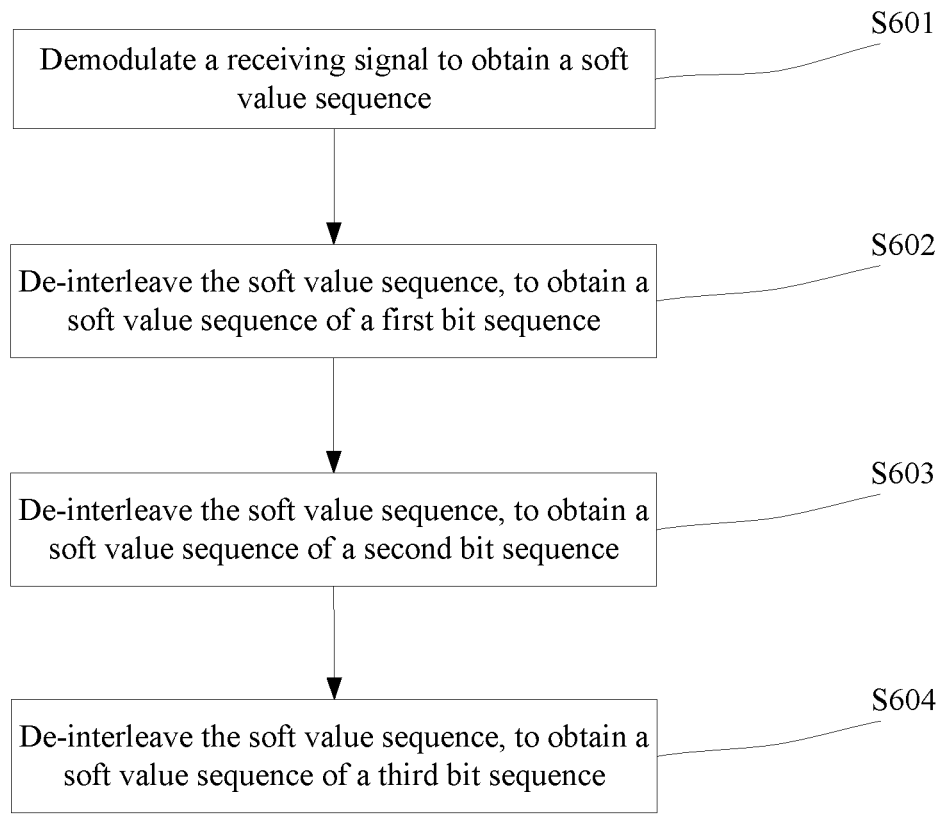
FIG. 8 is a schematic diagram of still another method for performing data transmission by a data receiving device according to an embodiment of this application.

The data sending device interleaves a first bit sequence and a second bit sequence by using the data transmission method shown in FIG. 7, and a data receiving device may perform de-interleaving by using a method shown in FIG. 8.

The method execution steps S601, S602, and S603 shown in FIG. 8 are the same as the method execution steps S401, S402, and S403 shown in FIG. 6. Details are not described herein again. The following describes only differences.

S604: A data receiving device de-interleaves the soft value sequence, to obtain a soft value sequence of a third bit sequence.

There is no sequence between S602, S603, and S604.

A process of interleaving performed by a data sending device in this embodiment of this application may be performed in the following manner.

A: Determine a quantity of rows of an interleaving matrix and a quantity of columns of the interleaving matrix based on a length of a to-be-interleaved bit sequence.

It is assumed that the to-be-interleaved bit sequence is $d_0^{(1)}, d_1^{(1)}, d_2^{(1)}, \ldots, d_{D-1}^{(1)}$ in this embodiment of this application, where D is the length of the to-be-interleaved bit sequence.

In this embodiment of this application, the length of the to-be-interleaved bit sequence, the quantity of rows of the interleaving matrix, and the quantity of columns of the interleaving matrix satisfy a formula D≤(M×N), where D is the length of the to-be-interleaved bit sequence, M is the quantity of rows of the interleaving matrix, and N is the quantity of columns of the interleaving matrix.

In an interleaving matrix whose quantity of rows is M and whose quantity of columns is N in this embodiment of this application, column numbers are successively 0, 1, 2, . . . , N−1 from left to right, and row numbers are successively 0, 1, 2, . . . , M−1 from top to bottom.

B: Determine, based on the determined quantity of rows of the interleaving matrix, the determined quantity of columns of the interleaving matrix, and the length of the to-be-interleaved bit sequence, an interleaving bit sequence written into the interleaving matrix.

In this embodiment of this application, when (M×N)>D, a quantity $N_D=(M \times N - D)$ of dummy bits may be added to the interleaving bit sequence.

Therefore, a $0^{th}$ bit to an $(N_{D-1})^{th}$ bit in the interleaving bit sequence in this embodiment of this application are dummy bits, where $N_D=(M\times N-D)$, and an $N_D^{th}$ bit to an $(M\times N-1)^{th}$ bit in the interleaving bit sequence are successively a 0bit to a $(D-1)^{th}$ bit in the to-be-interleaved bit sequence.

C: Write a bit in the interleaving bit sequence row by row into an interleaving matrix whose size is (M×N).

In this embodiment of this application, the interleaving bit sequence is expressed as $y_k$, $y_k$=<NULL>, k=0, 1, . . . , and $N_D-1$, and <NULL> indicates a dummy bit.

$y_{N_D+k} = d_k^{(i)}$, k=0, 1, . . . ,D−1, and $N_D=(M\times N-D)$, where $d_k^{(i)}$ indicates a to-be-interleaved bit. The bit interleaving sequence $y_k$, starting from $y_0$, is written row by row into the interleaving matrix whose size is (M×N), a start write location of the matrix is at the $0^{th}$ column of the $0^{th}$ row, and the interleaving matrix into which the interleaving bit sequence is written may be expressed as:

$$\begin{bmatrix} y_0 & y_1 & y_2 & \cdots & y_{N-1} \\ y_N & y_{N+1} & y_{N+2} & \cdots & y_{2N-1} \\ \vdots & \vdots & \vdots & \ddots & \vdots \\ y_{(M-1)\times N} & y_{(M-1)\times N+1} & y_{(M-1)\times N+2} & \cdots & y_{(M\times N-1)} \end{bmatrix}$$

D: After column transformation is performed on the interleaving matrix into which the interleaving bit sequence is written, output a bit sequence column by column except the dummy bits, to obtain an interleaved bit sequence.

In this embodiment of this application, a pattern used during column transformation of the interleaving matrix into which the interleaving bit sequence is written may be obtained through table lookup.

In this embodiment of this application, the pattern for column transformation may be expressed as $\langle p(j) \rangle_{j \in \{0, 1, \ldots, N-1\}}$, where p(j) is an original column number of the $j^{th}$ column after the column transformation. In this embodiment of this application, a matrix obtained after the column transformation of the interleaving matrix written into the interleaving bit sequence is performed may be expressed as:

$$\begin{bmatrix} y_{p(0)} & y_{p(1)} & y_{p(2)} & \cdots & y_{p(N-1)} \\ y_{p(0)+N} & y_{p(1)+N} & y_{p(2)+N} & \cdots & y_{p(N-1)+N} \\ \vdots & \vdots & \vdots & \ddots & \vdots \\ y_{p(0)+(M-1)\times N} & y_{p(0)+(M-1)\times N} & y_{p(2)+(M-1)\times N} & \cdots & y_{p(N-1)+(M-1)\times N} \end{bmatrix}$$

In this embodiment of this application, the bit sequence output column by column may be expressed as $v_0^{(i)}, v_1^{(i)}, v_2^{(i)}, \ldots, v_{K\pi-1}^{(i)}$, where $v_0^{(i)}$ corresponds to $y_{p(0)}$, $v_1^{(i)}$ corresponds to $y_{p(0)+N}$, . . . , and Kπ(M×N).

A process that the soft value sequence is de-interleaved by the data receiving device in this embodiment of this application may be performed in the following manner.

A: Determine a quantity of rows of a de-interleaving matrix and a quantity of columns of the interleaving matrix based on a length of a to-be-deinterleaved soft value sequence.

The length of the to-be-deinterleaved soft value sequence, the quantity of rows of the de-interleaving matrix, and the quantity of columns of the de-interleaving matrix satisfy a formula D≤(M×N), where D is the length of the to-be-deinterleaved soft value sequence, M is the quantity of rows of the de-interleaving matrix, and N is the quantity of columns of the de-interleaving matrix.

B: Write a soft value in the to-be-deinterleaved soft value sequence column by column into a de-interleaving matrix whose size is (M×N).

C: After column transformation is performed on the de-interleaving matrix into which the soft value is written, output a soft value sequence row by row, to obtain a de-interleaved soft value sequence.

It may be understood that de-interleaving is an inverse process of interleaving. Therefore, for more details about the description of the de-interleaving process in the embodiments of this application, reference may be made to the process related to interleaving.

In this embodiment of this application, the data sending device may perform interleaving by using an interleaver, and the data receiving device may perform de-interleaving by using a de-interleaver.

In this embodiment of this application, the following describes, with reference to actual application, a process that the data sending device interleaves, by using an interleaver, an information bit sequence $d_k^{(0)}$, a parity bit $d_k^{(1)}$ whose column weight is greater than 1, and at least one parity bit $d_k^{(2)}$ whose column weight is 1, and the data receiving device performs corresponding de-interleaving.

Figure 9:
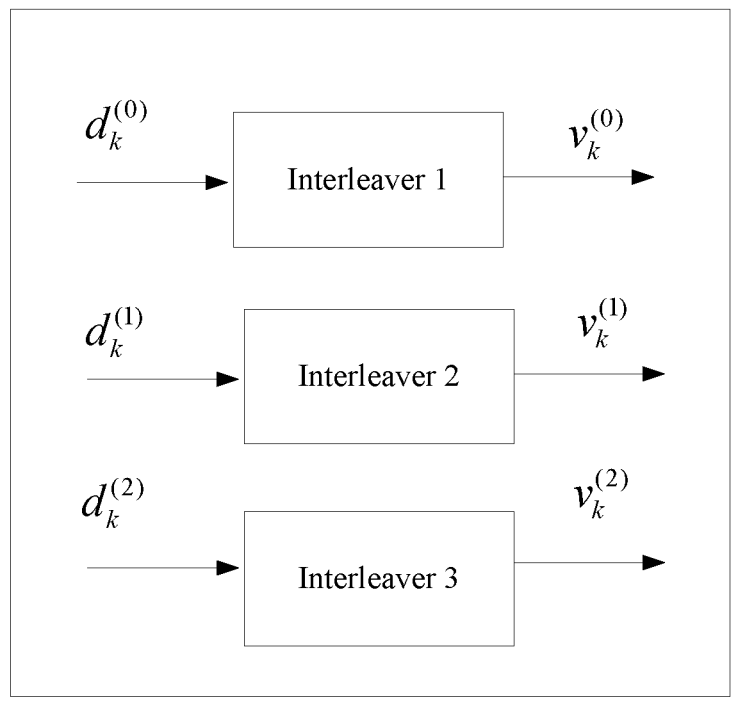
FIG. 9 is a first schematic diagram of an interleaving method according to an embodiment of this application.

In a possible implementation, the data sending device separately interleaves, by using different interleavers, the information bit sequence $d_k^{(0)}$, the parity bit $d_k^{(1)}$ whose column weight is greater than 1, and the parity bit $d_k^{(2)}$ whose column weight is 1. For example, in FIG. 9, all information bit sequences $d_k^{(0)}$ are interleaved by using an interleaver 1 to output an interleaved bit sequence $v_k^{(0)}$. All parity bits $d_k^{(1)}$ whose column weights are greater than 1 are interleaved by using an interleaver 2 to output an interleaved bit sequence $v_k^{(1)}$. All parity bits $d_k^{(2)}$ whose column weights are 1 are interleaved by using an interleaver 3 to output an interleaved bit sequence $v_k^{(2)}$.

Figure 10:
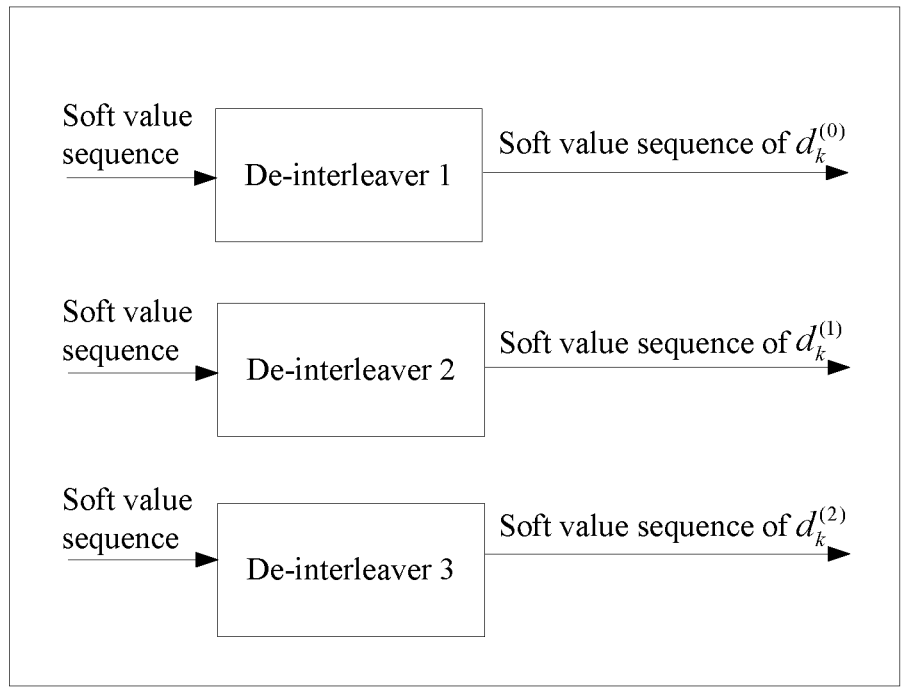
FIG. 10 is a first schematic diagram of a de-interleaving method according to an embodiment of this application.

The data receiving device de-interleaves the soft value sequence by using different de-interleavers, to obtain soft value sequences of all information bit sequences, soft value sequences of all parity bits whose column weights are greater than 1, and soft value sequences of all parity bits whose column weights are 1. For example, in FIG. 10, a soft value sequence is de-interleaved by using a de-interleaver 1 to output a soft value sequence of an information bit sequence $d_k^{(0)}$, is de-interleaved by using a de-interleaver 2 to output a soft value sequence of a parity bit $d_k^{(1)}$ whose column weight is greater than 1, and is de-interleaved by using a de-interleaver 3 to output a soft value sequence of a parity bit $d_k^{(2)}$ whose column weight is 1.

In this embodiment of this application, the data sending device separately interleaves, by using different interleavers, the information bit sequence $d_k^{(0)}$, the parity bit $d_k^{(1)}$ whose column weight is greater than 1, and the parity bit $d_k^{(2)}$ whose column weight is 1. The interleaver 1, the interleaver 2, and the interleaver 3 are three independent interleavers, which can inherit current communications protocols in a Long Term Evolution system.

In a possible implementation, the data sending device interleaves, by using a first interleaver, all information bit sequences and all the parity bits whose column weights are greater than 1.

Figure 11:
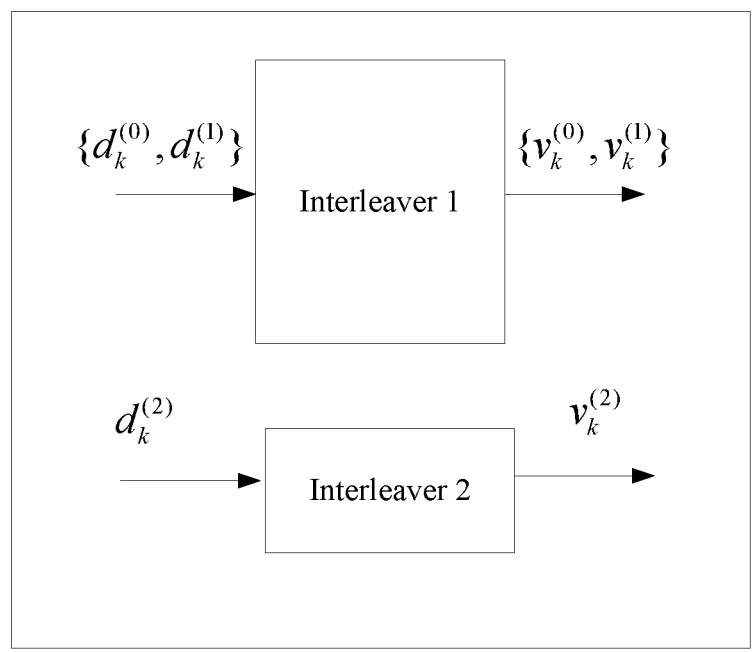
FIG. 11 is a second schematic diagram of an interleaving method according to an embodiment of this application.

The data sending device interleaves, by using a second interleaver, all or some of the parity bits whose column weights are 1. For example, in FIG. 11, all information bit sequences and all parity bits $\{d_k^{(0)}, d_k^{(1)}\}$ whose column weights are greater than 1 are interleaved by using the interleaver 1 to output an interleaved bit sequence $\{v_k^{(0)}, v_k^{(1)}\}$. All parity bits $d_k^{(2)}$ whose column weights are 1 are interleaved by using the interleaver 2 to output an interleaved bit sequence $v_k^{(2)}$.

Figure 12:
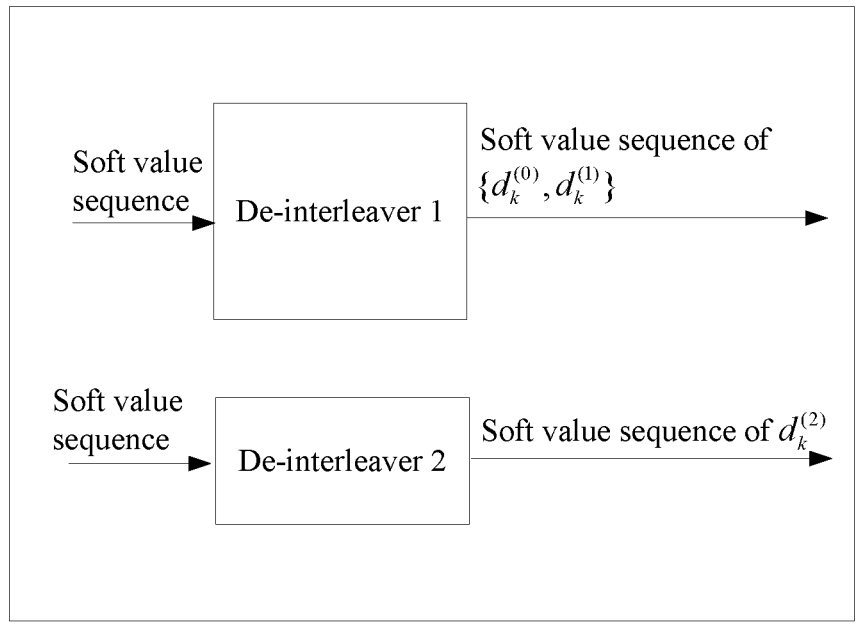
FIG. 12 is a second schematic diagram of a de-interleaving method according to an embodiment of this application.

The data receiving device de-interleaves a soft value sequence by using a first de-interleaver, to obtain soft value sequences that are of all information bit sequences and that are of all parity bits whose column weights are greater than 1, and de-interleaves the soft value sequence by using a second de-interleaver, to obtain soft value sequences of some parity bits whose column weights are 1 or soft value sequences of all parity bits whose column weights are 1. For example, in FIG. 12, a soft value sequence is de-interleaved by using a de-interleaver 1 to output soft value sequences that are of all information bit sequences and that are of all parity bits $\{d_k^{(0)}, d_k^{(1)}\}$ whose column weights are greater than 1, and is de-interleaved by using a de-interleaver 2 to output soft value sequences of all parity bits $d_k^{(2)}$ whose column weights are 1.

In this embodiment of this application, a manner in which the data sending device interleaves, by using the first interleaver, all information bit sequences and all the parity bits whose column weights are greater than 1, and interleaves, by using the second interleaver, all parity bits whose column weights are 1 may be applied to a scenario with relatively abundant storage resources.

Figure 13:
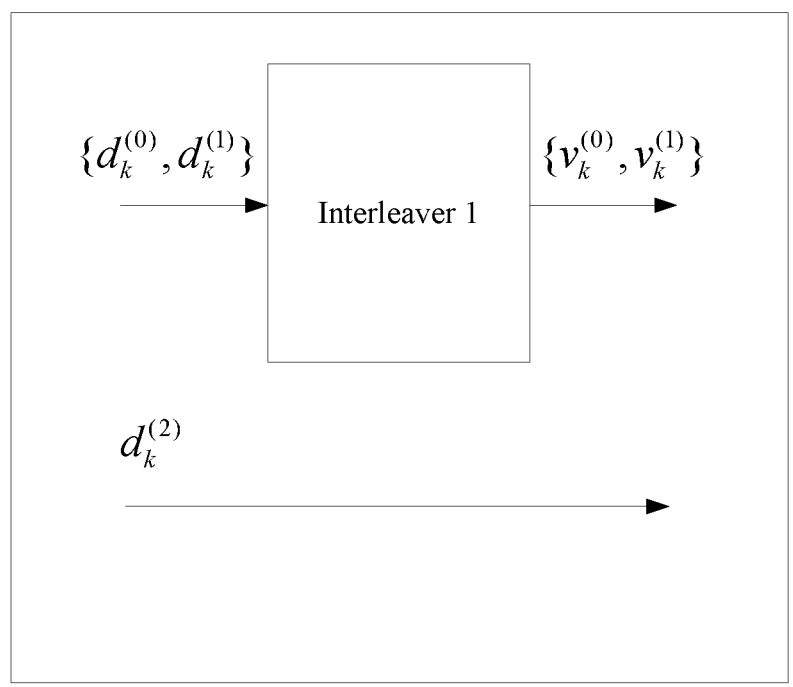
FIG. 13 is a third schematic diagram of an interleaving method according to an embodiment of this application.

In a possible implementation, the data sending device interleaves, by using the first interleaver, all information bit sequences and all the parity bits whose column weights are greater than 1, and does not interleave any parity bit whose column weight is 1. For example, in FIG. 13, all information bit sequences and all parity bits $\{d_k^{(0)}, d_k^{(1)}\}$ whose column weights are greater than 1 are interleaved by using an interleaver 1 to output an interleaved bit sequence $\{v_k^{(0)}, v_k^{(1)}\}$. Any parity bit $d_k^{(2)}$ whose column weight is 1 is not interleaved.

Figure 14:
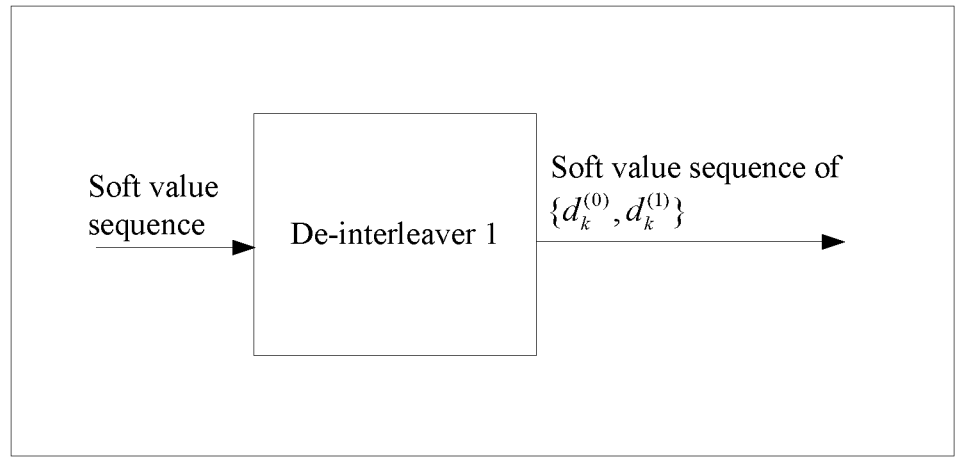
FIG. 14 is a third schematic diagram of a de-interleaving method according to an embodiment of this application.

The data receiving device de-interleaves the soft value sequence by using the first de-interleaver, to obtain soft value sequences that are of all information bit sequences and that are of all parity bits whose column weights are greater than 1. For example, as shown in FIG. 14, a soft value sequence is de-interleaved by using a de-interleaver 1 to output soft value) sequences that are of all information bit sequences and that are of all parity bits $\{d_k^{(0)}, d_k^{(1)}\}$ whose column weights are greater than 1.

In this embodiment of this application, the data sending device interleaves, by using the first interleaver, all information bit sequences and all the parity bits whose column weights are greater than 1, and does not interleave any parity bit whose column weight is 1. An interleaver has a relatively small size, a low storage pressure, and a low latency.

In a possible implementation, the data sending device interleaves, by using the first interleaver, all information bit sequences, all the parity bits whose column weights are greater than 1, and some parity bits whose column weights are 1.

Figure 15:
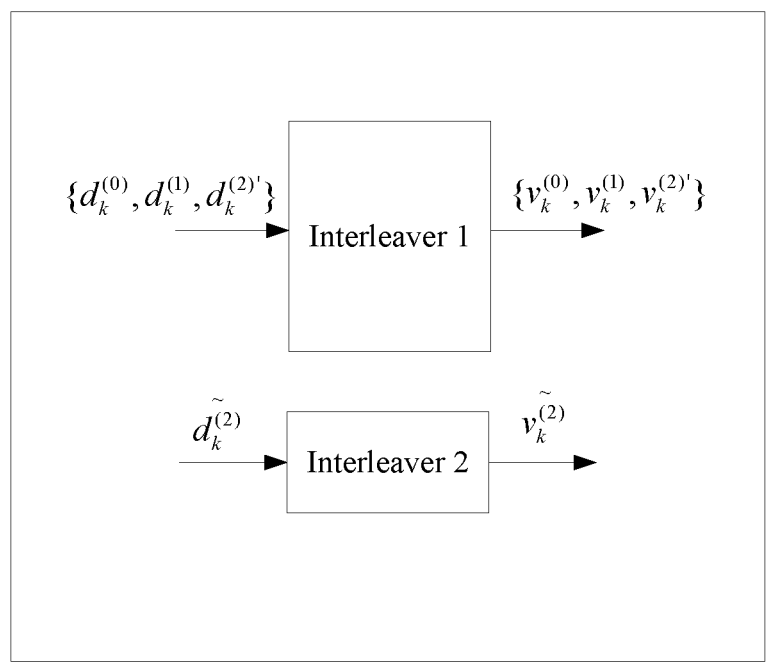
FIG. 15 is a fourth schematic diagram of an interleaving method according to an embodiment of this application.

The data sending device interleaves, by using the second interleaver, another parity bit, whose column weight is 1 and that is different from some parity bits whose column weights are 1 and that are interleaved by using the first interleaver, in parity bits whose column weights are 1. For example, as shown in FIG. 15, all information bit sequences, all parity bits whose column weights are greater than 1, and some parity bits $\{d_k^{(0)}, d_k^{(1)}, d_k^{(2)\prime}\}$ whose column weights are 1 are interleaved by using an interleaver 1 to output an inter-leaved) bit sequence $\{v_k^{(0)}, v_k^{(1)}, v_k^{(2)\prime}\}$. Another parity bit $\tilde{d}_k^{(2)}$, whose column weight is 1 and that is different from some parity bits whose column weights are 1 and that are interleaved by using the first interleaver, in parity bits whose column weights are 1 is interleaved by using an interleaver 2 to output an interleaved bit sequence $\tilde{v}_k^{(2)}$.

Figure 16:
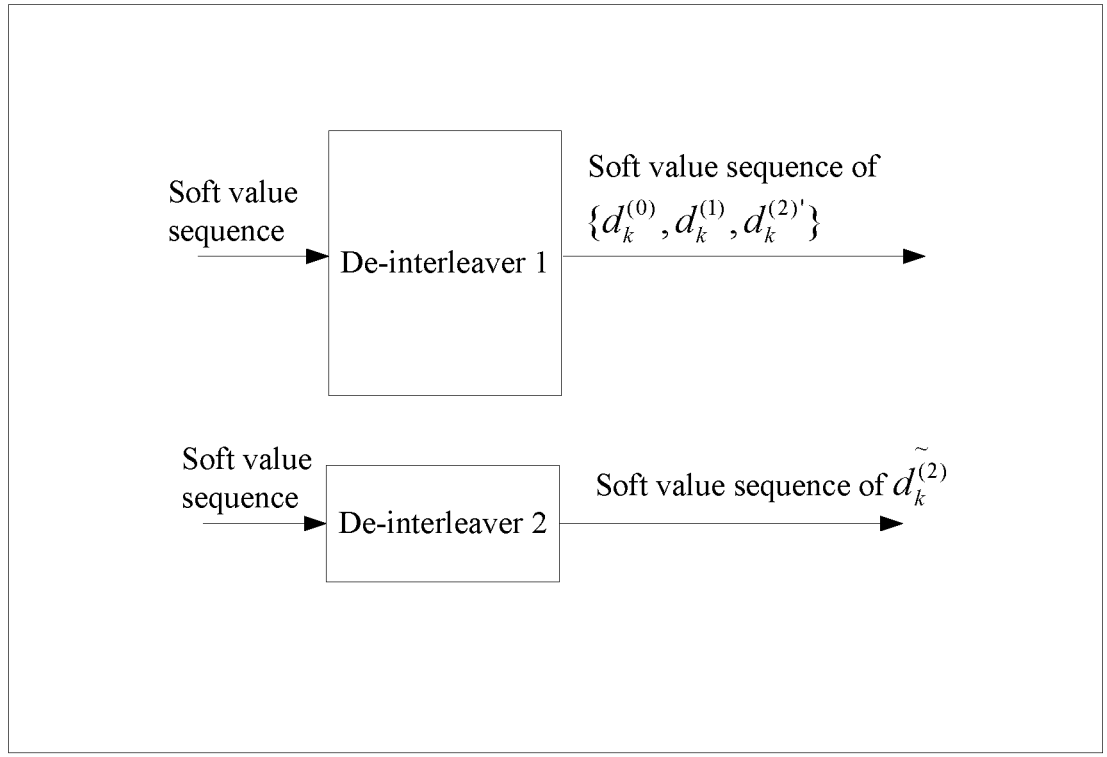
FIG. 16 is a fourth schematic diagram of a de-interleaving method according to an embodiment of this application.

The data receiving device de-interleaves a soft value sequence by using the first de-interleaver, to obtain soft value sequences that are of all information bit sequences, that are of all parity bits whose column weights are greater than 1, and that are of some parity bits whose column weights are 1, and de-interleaves the soft value sequence by using the second de-interleaver, to obtain a soft value sequence of another parity bit, whose column weight is 1 and that is different from some parity bits whose column weights are 1 and that are obtained by performing de-interleaving by using the first de-interleaver, in the parity bits whose column weights are 1. For example, in FIG. 16, a soft value sequence is de-interleaved by using a de-interleaver 1 to output soft value sequences that are of all information bit sequences, that are of all parity bits whose column weights are greater than 1, and that are of some parity bits $\{d_k^{(0)}, d_k^{(1)}, d_k^{(2)\prime}\}$ whose column weights are 1, and is de-interleaved by using a de-interleaver 2 to output a soft value sequence of another parity bit $d_k^{(2)}$, whose column weight is 1 and that is different from some parity bits whose column weights are 1 and that are interleaved by using the first interleaver, in the parity bits whose column weights are 1.

In this embodiment of this application, the foregoing some parity bits $d_k^{(2)\prime}$ whose column weights are 1 may be set based on a bit rate during initial transmission. If the bit rate during initial transmission is lower than $|d_k^{(0)}|/|(d_k^{(0)}, d_k^{(1)})|$, where | | indicates a length of a sequence, the first $d_k^{(2)\prime\prime}$ bits are selected from $d_k^{(2)}$, to enable a sequence $\{d_k^{(0)}, d_k^{(1)}, d_k^{(2)\prime\prime}\}$ to satisfy the bit rate during initial transmission.

In this embodiment of this application, the data sending device interleaves, by using the first interleaver, all information bit sequences, all parity bits whose column weights are greater than 1, and some parity bits whose column weights are 1, and interleaves, by using the second interleaver, another parity bit, whose column weight is 1 and that is different from some parity bits whose column weights are 1 and that are interleaved by using the first interleaver, in the parity bits whose column weights are 1, so that there is a relatively large quantity of bits that may be interleaved, to disperse bits of a Raptor-like LDPC code that have different importance to a greater extent.

In a possible implementation, the data sending device interleaves, by using the first interleaver, all information bit sequences, all the parity bits whose column weights are greater than 1, and some parity bits whose column weights are 1.

Figure 17:
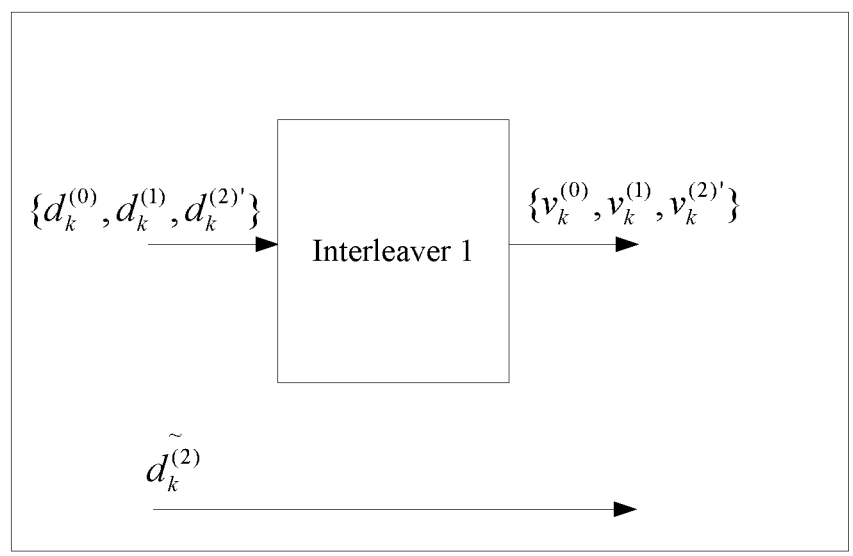
FIG. 17 is a fifth schematic diagram of an interleaving method according to an embodiment of this application.

The data sending device does not interleave another parity bit, whose column weight is 1 and that is different from some parity bits whose column weights are 1 and that are interleaved by using the first interleaver, in parity bits whose column weights are 1. For example, as shown in FIG. 17, all information bit sequences, all parity bits whose column weights are greater than 1, and some parity bits $\{d_k^{(0)}, d_k^{(1)}, d_k^{(2)\prime\prime}\}$ whose column weights are 1 are interleaved by using an interleaver 1 to output an interleaved bit sequence $\{v_k^{(0)}, v_k^{(1)}, v_k^{(2)\prime\prime}\}$. Another parity bit $\tilde{d}_k^{(2)}$, whose column weight is 1 and that is different from some parity bits whose column weights are 1 and that are interleaved by using the first interleaver, in the parity bits whose column weights are 1 is not interleaved.

Figure 18:
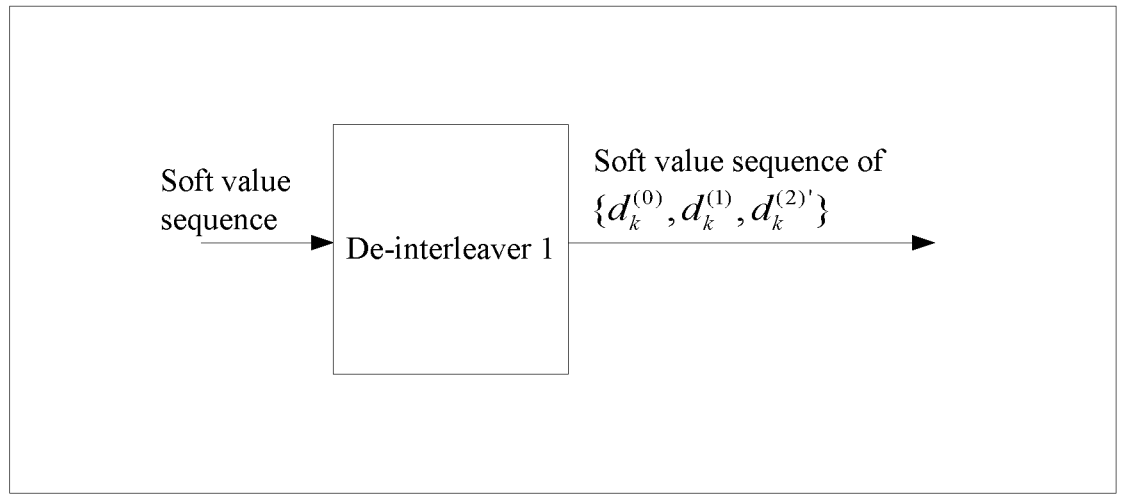
FIG. 18 is a fifth schematic diagram of a de-interleaving method according to an embodiment of this application.

The data receiving device de-interleaves a soft value sequence by using the first de-interleaver, to obtain soft value sequences that are of all information bit sequences, that are of all parity bits whose column weights are greater than 1, and that are of some parity bits whose column weights are 1. For example, as shown in FIG. 18, a soft value sequence is de-interleaved by using a de-interleaver 1 to output soft value sequences that are of all information bit sequences, that are of all parity bits whose column weights are greater than 1, and that are of some parity bits $\{d_k^{(0)}, d_k^{(1)}, d_k^{(2)}\}$ whose column weights are 1.

In this embodiment of this application, the foregoing some parity bits $d_k^{(2)\prime\prime}$ whose column weights are 1 may be set according to an actual status.

In this embodiment of this application, the data sending device interleaves, by using the first interleaver, all information bit sequences, all parity bits whose column weights are greater than 1, and some parity bits whose column weights are 1, and does not interleave another parity bit, whose column weight is 1 and that is different from some parity bits whose column weights are 1 and that are interleaved by using the first interleaver, in the parity bits whose column weights are 1, so that there is a relatively small quantity of interleavers for use, and a storage resource is saved when a quantity of bits that may be interleaved is ensured.

Figure 19:
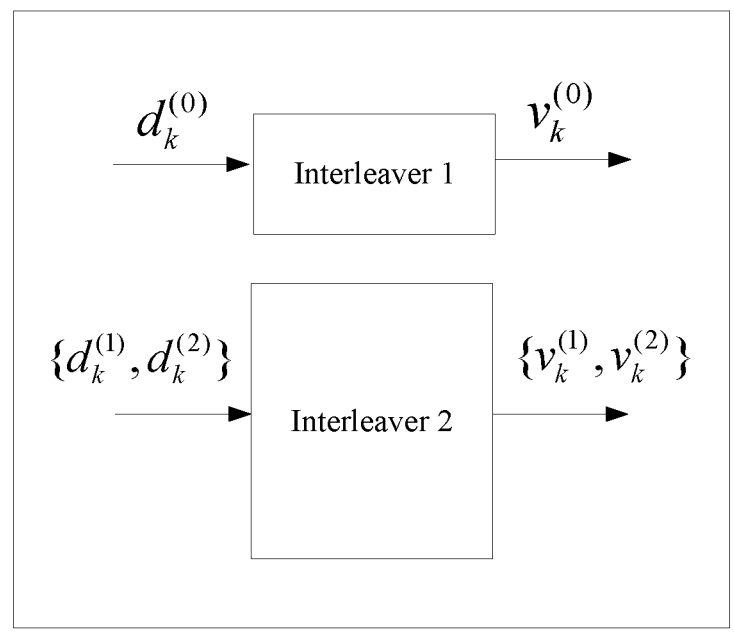
FIG. 19 is a sixth schematic diagram of an interleaving method according to an embodiment of this application.

In a possible implementation, the data sending device interleaves all information bit sequences by using the first interleaver, and interleaves, by using the second interleaver, all the parity bits whose column weights are greater than 1, and all or some of the parity bits whose column weights are 1. For example, in FIG. 19, all information bit sequences $d_k^{(0)}$ are interleaved by using an interleaver 1 to output an interleaved bit sequence $v_k^{(0)}$. All parity bits whose column weights are greater than 1 and all parity bits $\{d_k^{(1)}, d_k^{(2)}\}$ whose column weights are 1 are interleaved by using an interleaver 2 to output an interleaved bit sequence $\{v_k^{(1)}, v_k^{(2)}\}$.

Figure 20:
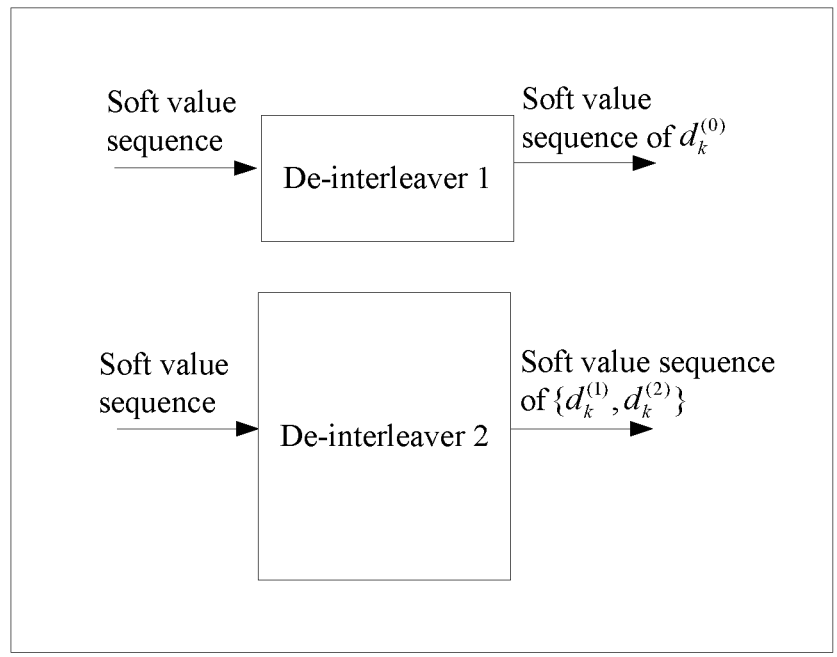
FIG. 20 is a sixth schematic diagram of a de-interleaving method according to an embodiment of this application.

The data receiving device de-interleaves the soft value sequence by using the first de-interleaver, to obtain soft value sequences of all information bit sequences, and de-interleaves the soft value sequence by using the second de-interleaver, to obtain soft value sequences that are of all parity bits whose column weights are greater than 1 and that are of some parity bits whose column weights are 1, or obtain soft value sequences that are of all parity bits whose column weights are greater than 1 and that are of all parity bits whose column weights are 1. For example, in FIG. 20, a soft value sequence is de-interleaved by using a de-interleaver 1 to output soft value sequences of all information bit sequences $d_k^{(0)}$, and is de-interleaved by using a de-interleaver 2 to output soft value sequences that are all parity bits whose column weights are greater than 1 and that are of all parity bits $\{d_k^{(1)}, d_k^{(2)}\}$ whose column weights are 1.

Figure 21:
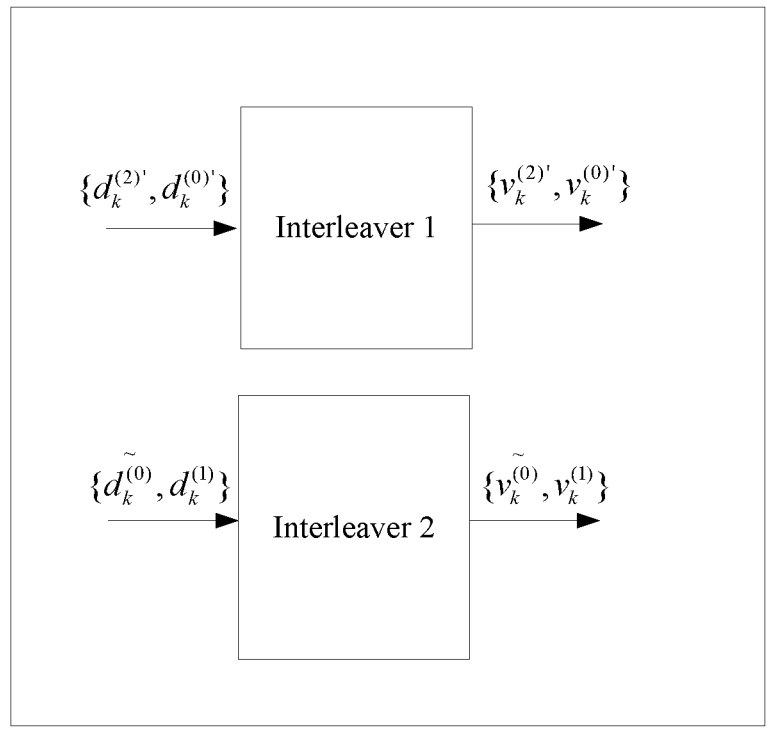
FIG. 21 is a seventh schematic diagram of an interleaving method according to an embodiment of this application.
Figure 22:
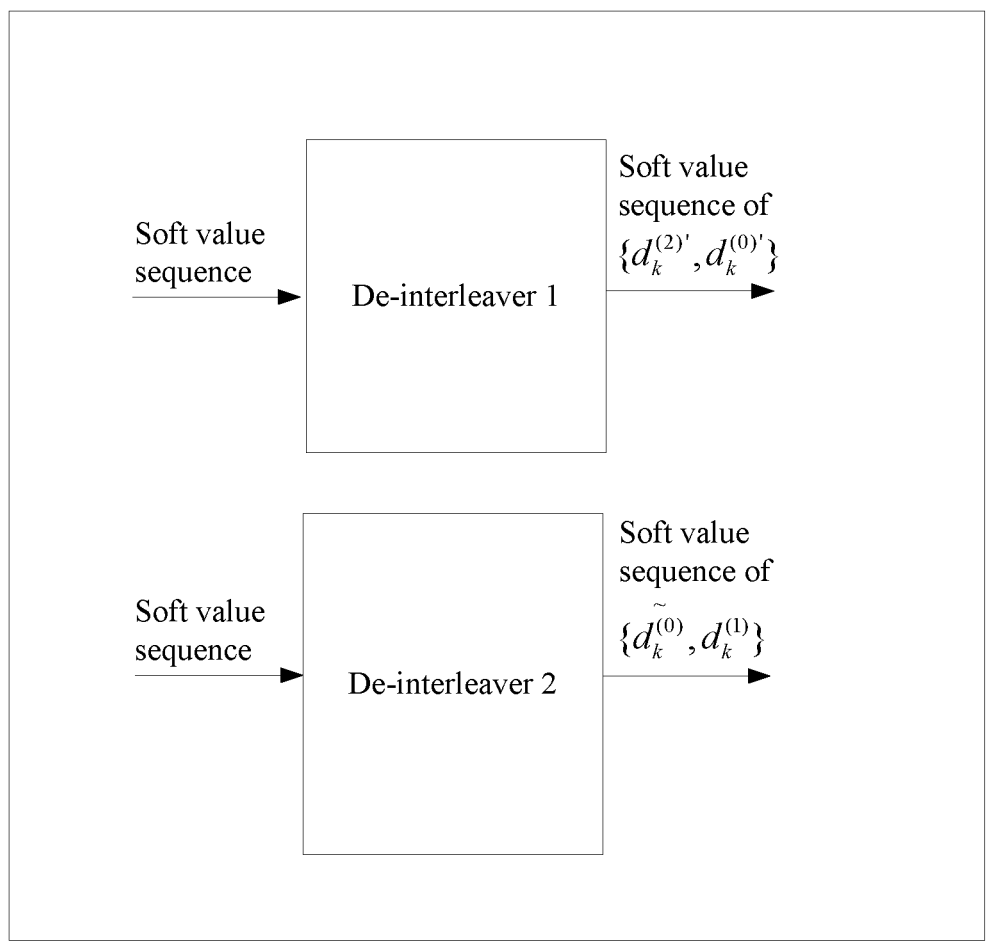
FIG. 22 is a seventh schematic diagram of a de-interleaving method according to an embodiment of this application.

In a possible implementation, the data sending device interleaves, by using the first interleaver, some parity bits whose column weights are 1, and all the information bit sequences, or some parity bits whose column weights are 1 and some information bit sequences, or all the parity bits whose column weights are 1 and all the information bit sequences, or all parity bits whose column weights are 1 and some information bit sequences. The data sending device interleaves a margin bit sequence by using the second interleaver. The margin bit sequence is a bit sequence that has a specified length and that is selected in descending order of priorities from a remaining information bit sequence that is not interleaved by the first interleaver, a parity bit whose column weight is greater than 1, and a remaining parity bit whose column weight is 1 and that is not interleaved by the first interleaver. For example, in FIG. 21, some parity bits whose column weights are 1 and some information bit sequence $\{d_k^{(2)\prime\prime}, d_k^{(0)\prime\prime}\}$ are interleaved by using an interleaver 1 to output an interleaved bit sequence $\{v_k^{(2)\prime\prime}, v_k^{(0)\prime\prime}\}$. The margin bit sequence includes a remaining information bit sequence $\tilde{d}_k^{(0)}$ that is not interleaved by the first interleaver, and a parity bit $d_k^{(1)}$ whose column weight is greater than 1. A margin bit sequence $\{\tilde{d}_k^{(0)}, d_k^{(1)}\}$ is interleaved by using the interleaver 1 to output an interleaved bit sequence $\{\tilde{v}_k^{(0)}, v_k^{(1)}\}$.

The data receiving device de-interleaves the soft value sequence by using the first de-interleaver, to obtain soft value sequences that are of some parity bits whose column weights are 1 and that are of all information bit sequences, or soft value sequences that are of some parity bits whose column weights are 1 and that are of some information bit sequences, or soft value sequences that are of all the parity bits whose column weights are 1 and that are of all the information bit sequences, or soft value sequences that are of all parity bits whose column weights are 1 and that are of some information bit sequences. The data receiving device de-interleaves the soft value sequence by using the second de-interleaver, to obtain a soft value sequence of a margin bit sequence. The margin bit sequence is a bit sequence that has a specified length and that is selected in descending order of priorities from a remaining information bit sequence that is not de-interleaved by the first de-interleaver, a parity bit whose column weight is greater than 1, and a remaining parity bit whose column weight is 1 and that is not de-interleaved by the first de-interleaver. For example, in FIG.

22, a soft value sequence is de-interleaved by using a de-interleaver 1 to output soft value sequences that are of some parity bits whose column weights are 1 and that are of some information bit sequences $\{d_k^{(2)\prime}, d_k^{(0)\prime}\}$, and is de-interleaved by using a de-interleaver 2 to output a soft value sequence of a margin bit sequence $\{\tilde{d}_k^{(0)}, d_k^{(1)}\}$.

In this embodiment of this application, a manner in which some (or all) parity bits whose column weights are 1 and all (or some) information bit sequences are interleaved by using the first interleaver, and the margin bit sequence is interleaved by using the second interleaver may be applied to a scenario of data packet retransmission. The length of the bit sequence selected from the margin bit sequence may be determined based on a length of a retransmitted data packet. For example, during retransmission, if the length of the retransmitted data packet is greater than a length of a parity bit whose column weight is 1 and that should have been transmitted previously but was not transmitted, some or all information bit sequences are selected to form a retransmitted data packet with the parity bit whose column weight is 1 and that should have been transmitted but was not transmitted. If a data packet needs to be retransmitted again, a new data packet is formed, based on a length of the data packet that is retransmitted again, by a remaining information bit sequence that is not interleaved by the first interleaver, a parity bit whose column weight is greater than 1, and a remaining parity bit whose column weight is 1 and that is not interleaved by the first interleaver.

Based on the data transmission method in the foregoing embodiments, the embodiments of this application further provide a data sending device and a data receiving device. It may be understood that, to implement the foregoing functions, the data sending device and the data receiving device include a corresponding hardware structure and/or software module for performing the functions. The embodiments of this application can be implemented in a form of hardware or a combination of hardware and computer software with reference to units and algorithm steps of examples described in the embodiments disclosed in this application. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of the technical solutions of the embodiments of this application.

Division of functional units may be performed on the data sending device and the data receiving device according to the foregoing method examples in the embodiments of this application. For example, each functional unit may be divided according to each function, or two or more functions may be integrated into one processing unit. The integrated unit may be implemented in a form of hardware, or may be implemented in a form of a software functional unit. It should be noted that the division of the units in the embodiments of this application is an example, and is merely logical function division, and there may be another division manner during actual implementation.

Figure 23:
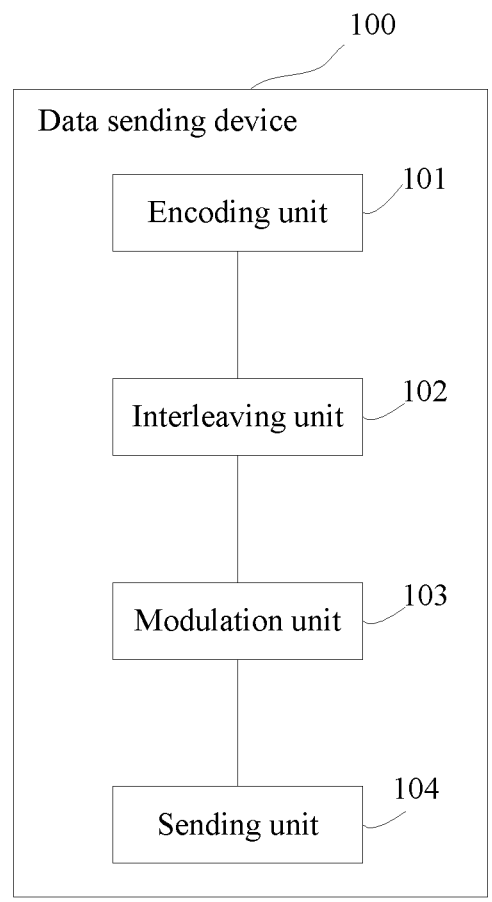
FIG. 23 is a schematic structural diagram of a data sending device according to an embodiment of this application.

In a case that an integrated unit is used, FIG. 23 is a schematic structural diagram of a data sending device 100 according to an embodiment of this application. Referring to FIG. 23, the data sending device 100 includes an encoding unit 101, an interleaving unit 102, a modulation unit 103, and a sending unit 104.

The encoding unit 101 is configured to encode information data by using an LDPC code matrix, to obtain a bit sequence, where the bit sequence includes a first bit sequence, and the first bit sequence includes at least one information bit in the bit sequence. The interleaving unit 102 is configured to interleave the first bit sequence obtained by the encoding unit 101 based on encoding, to obtain a first interleaved bit sequence. The modulation unit 103 is configured to perform modulation based on the first interleaved bit sequence obtained by the interleaving unit 102 by interleaving, to obtain a sending signal. The sending unit 104 is configured to send the sending signal obtained by performing modulation by the modulation unit 103.

The first bit sequence further includes at least one parity bit whose column weight is greater than 1 in the bit sequence.

The first bit sequence further includes at least one parity bit whose column weight is 1 in the bit sequence.

The first bit sequence includes all information bits in the bit sequence and all parity bits whose column weights are greater than 1 in the bit sequence. Alternatively, the first bit sequence includes all information bits in the bit sequence, all parity bits whose column weights are greater than 1 in the bit sequence, and at least one parity bit whose column weight is 1 in the bit sequence.

In a possible implementation, the bit sequence further includes a second bit sequence, and an intersection set between bits in the second bit sequence and bits in the first bit sequence is empty. The interleaving unit 102 is further configured to interleave the second bit sequence to obtain a second interleaved bit sequence. The modulation unit 103 performs modulation based on the first interleaved bit sequence and the second interleaved bit sequence to obtain the sending signal.

The first bit sequence includes all information bits in the bit sequence and all parity bits whose column weights are greater than 1 in the bit sequence, and the second bit sequence includes all parity bits whose column weights are 1 in the bit sequence. Alternatively, the first bit sequence includes all information bits in the bit sequence, all parity bits whose column weights are greater than 1 in the bit sequence, and at least one parity bit whose column weight is 1 in the bit sequence; and the second bit sequence includes at least one parity bit whose column weight is 1 in the bit sequence. Alternatively, the first bit sequence includes all information bits in the bit sequence, and the second bit sequence includes a parity bit whose column weight is greater than 1 in the bit sequence and at least one parity bit whose column weight is 1 in the bit sequence. Alternatively, the first bit sequence includes all information bits in the bit sequence and all parity bits whose column weights are 1 in the bit sequence, and the second bit sequence includes all parity bits whose column weights are greater than 1 in the bit sequence. Alternatively, the first bit sequence includes all information bits in the bit sequence and at least one parity bit whose column weight is 1 in the bit sequence, and the second bit sequence includes all parity bits whose column weights are greater than 1 in the bit sequence and at least one parity bit whose column weight is 1 in the bit sequence. Alternatively, the first bit sequence includes at least one information bit in the bit sequence and all parity bits whose column weights are 1 in the bit sequence, and the second bit sequence includes all parity bits whose column weights are greater than 1 in the bit sequence and at least one information bit in the bit sequence. Alternatively, the first bit sequence includes at least one information bit in the bit sequence and at least one parity bit whose column weight is 1 in the bit sequence, and the second bit sequence includes all parity bits whose column weights are greater than 1 in the bit sequence, at least one information bit in the bit sequence, and at least one parity bit whose column weight is 1 in the bit sequence.

In another possible implementation, the bit sequence further includes a third bit sequence, an intersection set between bits in the third bit sequence and the bits in the first bit sequence is empty, and an intersection set between the bits in the third bit sequence and the bits in the second bit sequence is empty.

The interleaving unit 102 is further configured to interleave the third bit sequence to obtain a third interleaved bit sequence. The modulation unit 103 performs modulation based on the first interleaved bit sequence, the second interleaved bit sequence, and the third interleaved bit sequence to obtain the sending signal.

The first bit sequence includes all information bits in the bit sequence, the second bit sequence includes all parity bits whose column weights are greater than 1 in the bit sequence, and the third bit sequence includes at least one parity bit whose column weight is equal to 1 in the bit sequence.

The interleaving unit 102 performs interleaving in the following manner:

determining a quantity of rows of an interleaving matrix and a quantity of columns of the interleaving matrix based on a length of a to-be-interleaved bit sequence, where the length of the to-be-interleaved bit sequence, the quantity of rows of the interleaving matrix, and the quantity of columns of the interleaving matrix satisfy a formula $D \leq (M \times N)$, where D is the length of the to-be-interleaved bit sequence, M is the quantity of rows of the interleaving matrix, and N is the quantity of columns of the interleaving matrix; determining, based on the determined quantity of rows of the interleaving matrix, the determined quantity of columns of the interleaving matrix, and the length of the to-be-interleaved bit sequence, an interleaving bit sequence written into the interleaving matrix, where a $0^{th}$ bit to an $(N_{D-1})^{th}$ bit in the interleaving bit sequence are dummy bits, $N_D=(M \times N-D)$, and an $N_D{}^{th}$ bit to an $(M \times N-1)^{th}$ bit in the interleaving bit sequence are successively a $0^{th}$ bit to a $(D-1)^{th}$ bit in the to-be-interleaved bit sequence; writing a bit in the interleaving bit sequence row by row into an interleaving matrix whose size is $(M \times N)$; and after performing column transformation on the interleaving matrix into which the interleaving bit sequence is written, outputting a bit sequence column by column except the dummy bits, to obtain an interleaved bit sequence.

Figure 24:
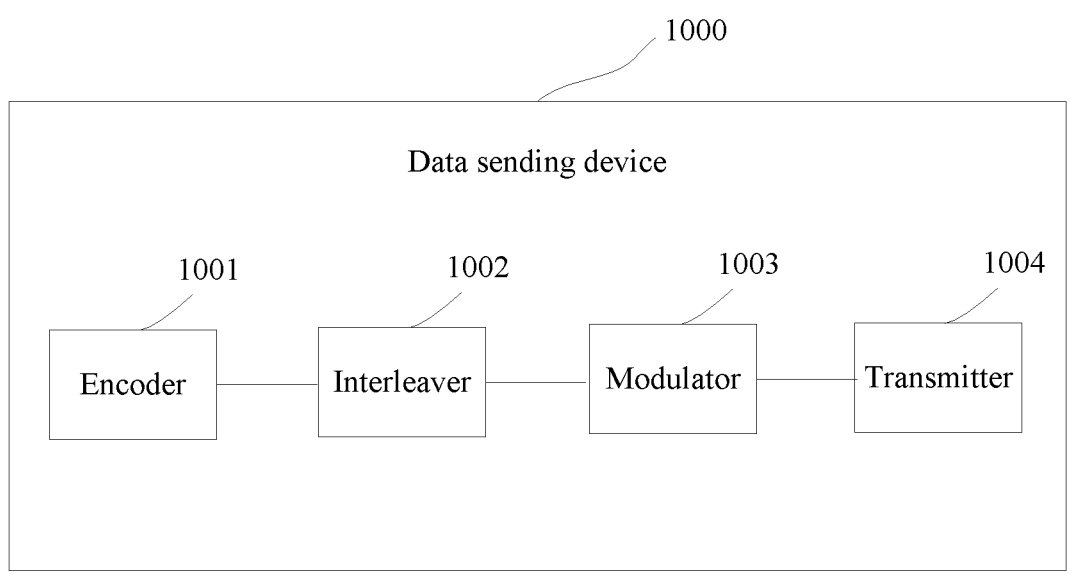
FIG. 24 is a schematic structural diagram of another data sending device according to an embodiment of this application.

During implementation in a form of hardware, in this embodiment of this application, the encoding unit 101 may be an encoder, the interleaving unit 102 may be an interleaver, the modulation unit 103 may be a modulator, and the sending unit 104 may be a transmitter. FIG. 24 is another schematic structural diagram of a data sending device according to an embodiment of this application. Referring to FIG. 24, the data sending device 1000 includes an encoder 1001, an interleaver 1002, a modulator 1003, and a transmitter 1004.

The encoder 1001 has a same function as the encoding unit 101, and is configured to implement a function of obtaining a bit sequence by encoding information data by using LDPC. The interleaver 1002 has a same function as the interleaving unit 102, and is configured to implement a function of interleaving a first bit sequence, a second bit sequence, and/or a third bit sequence. The modulator 1003 has a same function as the modulation unit 103, and is configured to implement a function of modulating a first interleaved bit sequence, a second interleaved bit sequence, and/or a third interleaved bit sequence. The transmitter 1004 has a same function as the sending unit 104, and is configured to implement a function of transmitting a sending signal. For specific functions of the encoder 1001, the interleaver 1002, the modulator 1003, and the transmitter 1004 in the data sending device 1000, reference may be made to the description of the data sending device 100 in the foregoing embodiment. Details are not described herein again.

In this embodiment of this application, the data sending device 100 and the data sending device 1000 have the function of performing data transmission by the data sending device in the foregoing method embodiments. For more details about descriptions of the embodiments of this application, reference may be made to related descriptions of the foregoing embodiments. Details are not described herein in the embodiments of this application.

Figure 25:
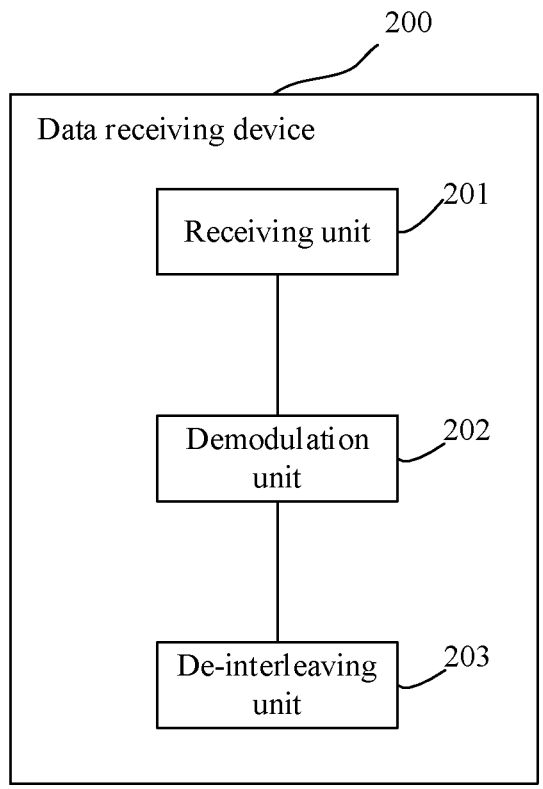
FIG. 25 is a schematic structural diagram of a data receiving device according to an embodiment of this application.

In a case that an integrated unit is used, FIG. 25 is a schematic structural diagram of a data receiving device 200 according to an embodiment of this application. Referring to FIG. 25, the data receiving device 200 includes a receiving unit 201, a demodulation unit 202, and a de-interleaving unit 203.

The receiving unit 201 is configured to receive a receiving signal. The demodulation unit 202 is configured to demodulate the receiving signal received by the receiving unit 201, to obtain a soft value sequence. The de-interleaving unit 203 is configured to de-interleave the soft value sequence to obtain a soft value sequence of a first bit sequence. The first bit sequence is a bit sequence obtained based on encoding by using an LDPC code matrix, and the first bit sequence includes at least one information bit in the bit sequence.

The first bit sequence further includes at least one parity bit whose column weight is greater than 1 in the bit sequence.

The first bit sequence further includes at least one parity bit whose column weight is 1 in the bit sequence.

The first bit sequence includes all information bits in the bit sequence and all parity bits whose column weights are greater than 1 in the bit sequence. Alternatively, the first bit sequence includes all information bits in the bit sequence, all parity bits whose column weights are greater than 1 in the bit sequence, and at least one parity bit whose column weight is 1 in the bit sequence.

In a possible implementation, the de-interleaving unit 203 is further configured to: after the demodulation unit 202 demodulates the receiving signal to obtain the soft value sequence, de-interleave the soft value sequence to obtain a soft value sequence of a second bit sequence. The second bit sequence is a bit sequence obtained based on encoding by using the LDPC code matrix, and an intersection set between bits in the second bit sequence and bits in the first bit sequence is empty.

The first bit sequence includes all information bits in the bit sequence and all parity bits whose column weights are greater than 1 in the bit sequence, and the second bit sequence includes all parity bits whose column weights are 1 in the bit sequence. Alternatively, the first bit sequence includes all information bits in the bit sequence, all parity bits whose column weights are greater than 1 in the bit sequence, and at least one parity bit whose column weight is 1 in the bit sequence; and the second bit sequence includes at least one parity bit whose column weight is 1 in the bit sequence. Alternatively, the first bit sequence includes all information bits in the bit sequence, and the second bit sequence includes a parity bit whose column weight is greater than 1 in the bit sequence and at least one parity bit whose column weight is 1 in the bit sequence. Alternatively, the first bit sequence includes all information bits in the bit sequence and all parity bits whose column weights are 1 in the bit sequence, and the second bit sequence includes all parity bits whose column weights are greater than 1 in the bit sequence. Alternatively, the first bit sequence includes all information bits in the bit sequence and at least one parity bit whose column weight is 1 in the bit sequence, and the second bit sequence includes all parity bits whose column weights are greater than 1 in the bit sequence and at least one parity bit whose column weight is 1 in the bit sequence. Alternatively, the first bit sequence includes at least one information bit in the bit sequence and all parity bits whose column weights are 1 in the bit sequence, and the second bit sequence includes all parity bits whose column weights are greater than 1 in the bit sequence and at least one information bit in the bit sequence. Alternatively, the first bit sequence includes at least one information bit in the bit sequence and at least one parity bit whose column weight is 1 in the bit sequence, and the second bit sequence includes all parity bits whose column weights are greater than 1 in the bit sequence, at least one information bit in the bit sequence, and at least one parity bit whose column weight is 1 in the bit sequence.

In another possible implementation, the de-interleaving unit 203 is further configured to: after the demodulation unit 202 demodulates the receiving signal to obtain the soft value sequence, to obtain a soft value sequence of a third bit sequence. The third bit sequence is a bit sequence obtained based on encoding by using the LDPC code matrix, an intersection set between bits in the third bit sequence and the bits in the first bit sequence is empty, and an intersection set between the bits in the third bit sequence and the bits in the second bit sequence is empty.

The first bit sequence includes all information bits in the bit sequence, the second bit sequence includes all parity bits whose column weights are greater than 1 in the bit sequence, and the third bit sequence includes at least one parity bit whose column weight is equal to 1 in the bit sequence.

The de-interleaving unit 203 de-interleaves the soft value sequence in the following manner:

determining a quantity of rows of a de-interleaving matrix and a quantity of columns of the interleaving matrix based on a length of a to-be-deinterleaved soft value sequence, where the length of the to-be-deinterleaved soft value sequence, the quantity of rows of the de-interleaving matrix, and the quantity of columns of the de-interleaving matrix satisfy a formula $D \le (M \times N)$, where D is the length of the to-be-deinterleaved soft value sequence, M is the quantity of rows of the de-interleaving matrix, and N is the quantity of columns of the de-interleaving matrix; writing, by the data receiving device, a soft value in the to-be-deinterleaved soft value sequence column by column into a de-interleaving matrix whose size is (M×N); and outputting a soft value sequence row by row after performing column transformation on the de-interleaving matrix into which the soft value is written, to obtain a de-interleaved soft value sequence.

Figure 26:
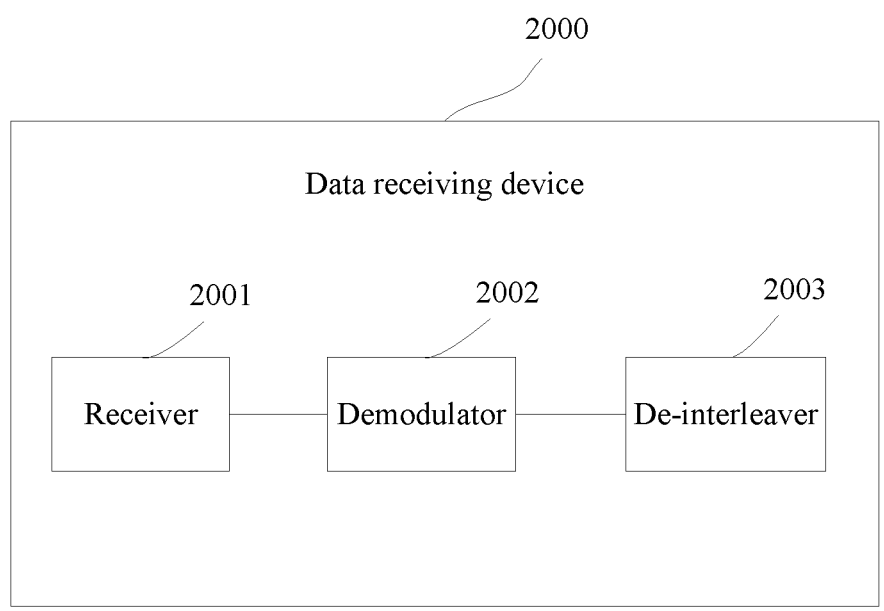
FIG. 26 is a schematic structural diagram of another data receiving device according to an embodiment of this application.

During implementation in a form of hardware, in this embodiment of this application, the receiving unit 201 may be a receiver, the demodulation unit 202 may be a demodulator, and the de-interleaving unit 203 may be a de-interleaver. FIG. 26 is another schematic structural diagram of a data receiving device according to an embodiment of this application. Referring to FIG. 26, the data receiving device 2000 includes a receiver 2001, a demodulator 2002, and a de-interleaver 2003.

The receiver 2001 has a same function as the receiving unit 201, and is configured to implement a function of receiving a receiving signal. The demodulator 2002 has a same function as the demodulation unit 202, and is configured to implement a function of demodulating the receiving signal to obtain a bit sequence including a first bit sequence, a second bit sequence, and/or a third bit sequence. The de-interleaver 2003 has a same function as the de-interleaving unit 203, and is configured to implement a function of de-interleaving a soft value sequence to obtain a soft value sequence that is of the first bit sequence, the second bit sequence, and/or the third bit sequence. For specific functions of the receiver 2001, the demodulator 2002, and the de-interleaver 2003 in the data receiving device 2000, reference may be made to the description of the data receiving device 200 in the foregoing embodiment. Details are not described herein again.

In this embodiment of this application, the data receiving device 200 and the data receiving device 2000 have the function of performing data transmission by the data receiving device in the foregoing method embodiments. For more details about descriptions of the embodiments of this application, reference may be made related to descriptions of the foregoing embodiments. Details are not described herein in the embodiments of this application.

Obviously, a person skilled in the art may make various modifications and variations to embodiments of this application without departing from the spirit and scope of this application. Therefore, the embodiments of this application are intended to cover these modifications and variations provided that they fall within the scope defined by the following claims and their equivalent technologies.

What is claimed is:

1. A data transmission method comprising:
   encoding, by a data sending device, information data by using a low-density parity-check (LDPC) matrix to obtain a bit sequence,
      wherein the bit sequence comprises a first bit sequence comprising (i) all information bits in the bit sequence, (ii) all parity bits in the bit sequence having column weights greater than 1 and (iii) a plurality of parity bits in the bit sequence, each having a column weight of 1,
      wherein each of the plurality of parity bits having a column weight of 1 is a parity bit sequence associated with a column having a column weight of 1 in the LDPC matrix, and
      wherein each of the parity bits having column weights greater than 1 is a parity bit sequence associated with a column having a column weight greater than 1 in the the LDPC matrix;
   interleaving, by the data sending device, the first bit sequence to obtain a first interleaved bit sequence;
   performing, by the data sending device, modulation based on the first interleaved bit sequence to obtain a signal; and
   transmitting, by the data sending device, the signal.

2. The method according to claim 1, wherein the bit sequence further comprises a second bit sequence, an intersection set between bits in the second bit sequence and bits in the first bit sequence is empty, and the method further comprises:
   interleaving, by the data sending device, the second bit sequence to obtain a second interleaved bit sequence, wherein the second bit sequence comprises a plurality of parity bits, having a column weight of 1, and being different from the plurality of parity bits in the first bit sequence; and wherein performing, by the data sending device, the modulation based on the first interleaved bit sequence to obtain the signal, and transmitting the signal comprises:
performing, by the data sending device, modulation based on the first interleaved bit sequence and the second interleaved bit sequence to obtain the signal, and sending the signal.

3. The method according to claim 2, wherein the first bit sequence consisting of one or more of the following (a) (g):
(a) all information bits in the first bit sequence and all parity bits having column weights greater than 1 in the first bit sequence, and the second bit sequence comprises all parity bits having column weights of 1 in the first bit sequence;
(b) all information bits in the first bit sequence, all parity bits having column weights greater than 1 in the first bit sequence, and at least one parity bit having a column weight of 1 in the first bit sequence; and the second bit sequence comprises at least one parity bit having a column weight of 1 in the first bit sequence;
(c) all information bits in the first bit sequence, and the second bit sequence comprises a parity bit having a column weight greater than 1 in the first bit sequence and at least one parity bit having a column weight of 1 in the first bit sequence;
(d) all information bits in the first bit sequence and all parity bits having column weights of 1 in the first bit sequence, and the second bit sequence comprises all parity bits having column weights greater than 1 in the first bit sequence;
(e) all information bits in the first bit sequence and at least one parity bit having column weight of 1 in the first bit sequence, and the second bit sequence comprises all parity bits having column weights greater than 1 in the first bit sequence and at least one parity bit having a column weight of 1 in the first bit sequence;
(f) at least one information bit in the first bit sequence and all parity bits having column weights of 1 in the first bit sequence, and the second bit sequence comprises all parity bits having column weights greater than 1 in the first bit sequence and at least one information bit in the first bit sequence; and
(g) at least one information bit in the first bit sequence and at least one parity bit having a column weight of 1 in the first bit sequence, and the second bit sequence comprises all parity bits having column weights greater than 1 in the first bit sequence, at least one information bit in the first bit sequence, and at least one parity bit having a column weight of 1 in the first bit sequence.

4. The method according to claim 2, wherein the bit sequence further comprises a third bit sequence, an intersection set between bits in the third bit sequence and the bits in the first bit sequence is empty, and an intersection set between the bits in the third bit sequence and the bits in the second bit sequence is empty; and the method further comprises:
interleaving, by the data sending device, the third bit sequence to obtain a third interleaved bit sequence, wherein the third bit sequence comprises a plurality of parity bits having a column weight of 1 and that is different from the plurality of parity bits in the first bit sequence; and
wherein performing, by the data sending device, the modulation based on the first interleaved bit sequence to obtain the signal, and transmitting the signal comprises:
performing, by the data sending device, modulation based on the first interleaved bit sequence, the second interleaved bit sequence, and the third interleaved bit sequence to obtain the signal, and sending the signal.

5. The method according to claim 4, wherein the first bit sequence comprises all information bits in the bit sequence, the second bit sequence comprises all parity bits having column weights greater than 1 in the bit sequence, and the third bit sequence comprises at least one parity bit having column weight is equal to 1 in the bit sequence.

6. The method according to claim 1, wherein interleaving the first bit sequence to obtain the first interleaved bit sequences comprises:
determining a quantity of rows of an interleaving matrix and a quantity of columns of the interleaving matrix based on a length of a to-be-interleaved bit sequence, wherein the length of the to-be-interleaved bit sequence, the quantity of rows of the interleaving matrix, and the quantity of columns of the interleaving matrix satisfy a formula D≤(M×N),
wherein D is the length of the to-be-interleaved bit sequence, M is the quantity of rows of the interleaving matrix, and N is the quantity of columns of the interleaving matrix;
determining, based on the determined quantity of rows of the interleaving matrix, the determined quantity of columns of the interleaving matrix, and the length of the to-be-interleaved bit sequence, an interleaving bit sequence written into the interleaving matrix, wherein a 0th bit to an $(N_{D-1})^{th}$ bit in the interleaving bit sequence are dummy bits, $N_D=(M\times N-D)$, and an $N_D{}^{th}$ bit to an $(M\times N-1)^{th}$ bit in the interleaving bit sequence are successively a $0^{th}$ bit to a $(D-1)^{th}$ bit in the to-be-interleaved bit sequence;
writing a bit in the interleaving bit sequence row by row into an interleaving matrix having size (M×N); and
after column transformation is performed on the interleaving matrix into which the interleaving bit sequence is written, outputting a bit sequence column by column except the dummy bits, to obtain an interleaved bit sequence.

7. A data sending device comprising:
an encoder configured to encode information data, by using a low-density parity-check (LDPC) matrix, to obtain a bit sequence,
wherein the bit sequence comprises a first bit sequence, and the first bit sequence comprises all information bits in the bit sequence and all parity bits having a column weights greater than 1 in the bit sequence and a plurality of parity bits having a column weight of 1 in the bit sequence,
wherein the one or more of the parity bits having a column weight of 1 is a parity bit sequence associated with a column having a column weight of 1 in the LDPC matrix, and
wherein the one or more of parity bits having a column weight greater than 1 is a parity bit sequence associated with a column having a column weight greater than 1 in the LDPC matrix;
an interleaver configured to interleave the first bit sequence obtained, based on encoding by the encoder, to obtain a first interleaved bit sequence;
a modulator configured to perform modulation based on the first interleaved bit sequence obtained by interleaving by the interleaver to obtain a signal; and
a transmitter configured to send the signal obtained by performing the modulation by the modulator.

8. The data sending device according to claim 7, wherein the bit sequence further comprises a second bit sequence, wherein the second bit sequence comprises a plurality of parity bits having a column weight of 1 and that is different from the plurality of parity bits in the first bit sequence and an intersection set between bits in the second bit sequence and bits in the first bit sequence is empty;
the interleaver is further configured to interleave the second bit sequence to obtain a second interleaved bit sequence; and
the modulator performs modulation based on the first interleaved bit sequence to obtain the signal by performing modulation based on the first interleaved bit sequence and the second interleaved bit sequence to obtain the sending signal.

9. The data sending device according to claim 8, wherein the first bit sequence consisting of one or more of the following (a)-(g):
(a) all information bits in the first bit sequence and all parity bits having column weights greater than 1 in the first bit sequence, and the second bit sequence comprises all parity bits having column weights of 1 in the first bit sequence;
(b) all information bits in the first bit sequence, all parity bits having column weights greater than 1 in the first bit sequence, and at least one parity bit having a column weight of 1 in the first bit sequence; and the second bit sequence comprises at least one parity bit having a column weight of 1 in the first bit sequence;
(c) all information bits in the first bit sequence, and the second bit sequence comprises a parity bit having column weight greater than 1 in the first bit sequence and at least one parity bit having a column weight of 1 in the first bit sequence;
(d) all information bits in the first bit sequence and all parity bits having column weights of 1 in the first bit sequence, and the second bit sequence comprises all parity bits having column weights greater than 1 in the first bit sequence;
(e) all information bits in the first bit sequence and at least one parity bit having column weight of 1 in the first bit sequence, and the second bit sequence comprises all parity bits having column weights greater than 1 in the first bit sequence and at least one parity bit having column weight of 1 in the first bit sequence;
(f) at least one information bit in the first bit sequence and all parity bits having column weights of 1 in the first bit sequence, and the second bit sequence comprises all parity bits having column weights greater than 1 in the first bit sequence and at least one information bit in the first bit sequence; and
(g) at least one information bit in the first bit sequence and at least one parity bit having a column weight of 1 in the first bit sequence, and the second bit sequence comprises all parity bits having column weights greater than 1 in the first bit sequence, at least one information bit in the first bit sequence, and at least one parity bit whose having column weight of 1 in the first bit sequence.

10. The data sending device according to claim 8, wherein the bit sequence further comprises a third bit sequence, wherein the third bit sequence comprises a plurality of parity bits having a column weight of 1 and that is different from the plurality of parity bits in the first bit sequence, an intersection set between bits in the third bit sequence and the bits in the first bit sequence is empty, and an intersection set between the bits in the third bit sequence and the bits in the second bit sequence is empty;
the interleaver is further configured to interleave the third bit sequence to obtain a third interleaved bit sequence; and
the modulator performs modulation based on the first interleaved bit sequence to obtain the signal by performing modulation based on the first interleaved bit sequence, the second interleaved bit sequence, and the third interleaved bit sequence to obtain the sending signal.

11. The data sending device according to claim 10, wherein the first bit sequence comprises all information bits in the bit sequence, the second bit sequence comprises all parity bits having column weights greater than 1 in the bit sequence, and the third bit sequence comprises at least one parity bit having column weight is equal to 1 in the bit sequence.

12. The data sending device according to claim 7, wherein the interleaver performs interleaving by:
determining a quantity of rows of an interleaving matrix and a quantity of columns of the interleaving matrix based on a length of a to-be-interleaved bit sequence, wherein the length of the to-be-interleaved bit sequence, the quantity of rows of the interleaving matrix, and the quantity of columns of the interleaving matrix satisfy a formula D≥(M×N), and
wherein D is the length of the to-be-interleaved bit sequence, M is the quantity of rows of the interleaving matrix, and N is the quantity of columns of the interleaving matrix;
determining, based on the determined quantity of rows of the interleaving matrix, the determined quantity of columns of the interleaving matrix, and the length of the to-be-interleaved bit sequence, an interleaving bit sequence written into the interleaving matrix, wherein a $0^{th}$ bit to an $(N_{D-1})^{th}$ bit in the interleaving bit sequence are dummy bits, $N_D=(M\times N-D)$, and an $N_D^{th}$ bit to an $(M\times N-1)^{th}$ bit in the interleaving bit sequence are successively a $0^{th}$ bit to a $(D-1)^{th}$ bit in the to-be-interleaved bit sequence;
writing a bit in the interleaving bit sequence row by row into an interleaving matrix having size (M×N); and
after performing column transformation on the interleaving matrix into which the interleaving bit sequence is written, outputting a bit sequence column by column except the dummy bits, to obtain an interleaved bit sequence.

13. A non-transitory, computer readable medium storing instructions for execution by a computer, wherein the instructions, when executed by the computer, provide at least the following operations:
encoding information data by using a low-density parity-check (LDPC) matrix, to obtain a bit sequence,
wherein the bit sequence comprises a first bit sequence comprising (i) all information bits in the bit sequence, (ii) all parity bits in the bit sequence having column weights greater than 1 and (iii) a plurality of parity bits in the bit sequence, each having a column weight of 1,
wherein each of the plurality of parity bits having a column weight of 1 is a parity bit sequence associated with a column having a column weight of 1 in the LDPC matrix, and wherein each of the parity bits having column weights greater than 1 is a parity bit sequence associated with a column having a column weight greater than 1 in the LDPC matrix;

interleaving the first bit sequence to obtain a first interleaved bit sequence;

performing modulation based on the first interleaved bit sequence to obtain a signal; and transmitting the signal.

14. The non-transitory, computer readable medium of claim 13, wherein the instructions further provide for the following operations:

interleaving the second bit sequence to obtain a second interleaved bit sequence, wherein the second bit sequence comprises a plurality of parity bits having a column weight of 1 and that is different from the plurality of parity bits in the first bit sequence; and wherein performing the modulation based on the first interleaved bit sequence to obtain the signal, and transmitting the signal comprises:

performing modulation based on the first interleaved bit sequence and the second interleaved bit sequence to obtain the signal, and sending the signal.

15. The non-transitory, computer readable medium of claim 14, wherein the first bit sequence consisting of one or more of the following (a)-(g):

(a) all information bits in the first bit sequence and all parity bits having column weights greater than 1 in the first bit sequence, and the second bit sequence comprises all parity bits having column weights of 1 in the first bit sequence;

(b) all information bits in the first bit sequence, all parity bits having column weights greater than 1 in the first bit sequence, and at least one parity bit having a column weight of 1 in the first bit sequence; and the second bit sequence comprises at least one parity bit having a column weight of 1 in the first bit sequence;

(c) all information bits in the first bit sequence, and the second bit sequence comprises a parity bit having a column weight greater than 1 in the first bit sequence and at least one parity bit having a column weight of 1 in the first bit sequence;

(d) all information bits in the first bit sequence and all parity bits having column weights of 1 in the first bit sequence, and the second bit sequence comprises all parity bits having column weights greater than 1 in the first bit sequence;

(e) all information bits in the first bit sequence and at least one parity bit having column weight of 1 in the first bit sequence, and the second bit sequence comprises all parity bits having column weights greater than 1 in the first bit sequence and at least one parity bit having a column weight of 1 in the first bit sequence;

(f) at least one information bit in the first bit sequence and all parity bits having column weights of 1 in the first bit sequence, and the second bit sequence comprises all parity bits having column weights greater than 1 in the first bit sequence and at least one information bit in the first bit sequence; and (g) at least one information bit in the first bit sequence and at least one parity bit having a column weight of 1 in the first bit sequence, and the second bit sequence comprises all parity bits having column weights greater than 1 in the first bit sequence, at least one information bit in the first bit sequence, and at least one parity bit having a column weight of 1 in the first bit sequence.

16. The non-transitory, computer readable medium of claim 14, wherein the bit sequence further comprises a third bit sequence, an intersection set between bits in the third bit sequence and the bits in the first bit sequence is empty, and an intersection set between the bits in the third bit sequence and the bits in the second bit sequence is empty.

17. The non-transitory, computer readable medium of claim 16, wherein the instructions further provide for the following operations:

interleaving the third bit sequence to obtain a third interleaved bit sequence, wherein the third bit sequence comprises a plurality of parity bits having a column weight of 1 and that is different from the plurality of parity bits in the first bit sequence; and wherein performing the modulation based on the first interleaved bit sequence to obtain the signal, and transmitting the signal comprises:

performing modulation based on the first interleaved bit sequence, the second interleaved bit sequence, and the third interleaved bit sequence to obtain the signal, and sending the signal.

18. The non-transitory, computer readable medium of claim 17, wherein the first bit sequence comprises all information bits in the bit sequence, the second bit sequence comprises all parity bits having column weights greater than 1 in the bit sequence, and the third bit sequence comprises at least one parity bit having column weight is equal to 1 in the bit sequence.

19. The method according to claim 13, wherein interleaving the first bit sequence to obtain the first interleaved bit sequences comprises:

determining a quantity of rows of an interleaving matrix and a quantity of columns of the interleaving matrix based on a length of a to-be-interleaved bit sequence, wherein the length of the to-be-interleaved bit sequence, the quantity of rows of the interleaving matrix, and the quantity of columns of the interleaving matrix satisfy a formula D≥(M×N), and wherein D is the length of the to-be-interleaved bit sequence, M is the quantity of rows of the interleaving matrix, and N is the quantity of columns of the interleaving matrix;

determining, based on the determined quantity of rows of the interleaving matrix, the determined quantity of columns of the interleaving matrix, and the length of the to-be-interleaved bit sequence, an interleaving bit sequence written into the interleaving matrix, wherein a $0^{th}$ bit to an $(N_{D-1})^{th}$ bit in the interleaving bit sequence are dummy bits, $N_D=(M \times N - D)$, and an $N_D^{th}$ bit to an $(M \times N - 1)^{th}$ bit in the interleaving bit sequence are successively a $0^{th}$ bit to a $(D-1)^{th}$ bit in the to-be-interleaved bit sequence;

writing a bit in the interleaving bit sequence row by row into an interleaving matrix having size (M×N); and after column transformation is performed on the interleaving matrix into which the interleaving bit sequence is written, outputting a bit sequence column by column, except the dummy bits, to obtain an interleaved bit sequence.

* * * * *

UNITED STATES PATENT AND TRADEMARK OFFICE
CERTIFICATE OF CORRECTION

Page 1 of 1

PATENT NO. : 10,938,514 B2
APPLICATION NO. : 16/446237
DATED : March 2, 2021
INVENTOR(S) : Liu et al.

It is certified that error appears in the above-identified patent and that said Letters Patent is hereby corrected as shown below:

In the Claims

Claim 3: Column 23, Line 10: "sequence consisting of one or more of the following (a) (g):" should read -- sequence consisting of one or more of the following (a) - (g): --.

Claim 9: Column 25, Line 59: "whose having column weight of 1 in the first bit" should read -- having column weight of 1 in the first bit --.

Signed and Sealed this
Fifteenth Day of March, 2022

Drew Hirshfeld
*Performing the Functions and Duties of the
Under Secretary of Commerce for Intellectual Property and
Director of the United States Patent and Trademark Office*